(12) United States Patent
Wu et al.

(10) Patent No.: US 10,564,682 B1
(45) Date of Patent: Feb. 18, 2020

(54) HINGE MECHANISM AND FLEXIBLE ELECTRONIC DEVICE HAVING THE SAME

(71) Applicant: FOSITEK CORPORATION, New Taipei (TW)

(72) Inventors: Yang-Zhong Wu, Shenzhen (CN); Yu-Feng Xu, Shenzhen (CN)

(73) Assignee: FOSITEK CORPORATION, New Taipei (TW)

( * ) Notice: Subject to any disclaimer, the term of this patent is extended or adjusted under 35 U.S.C. 154(b) by 0 days.

(21) Appl. No.: 16/441,852

(22) Filed: Jun. 14, 2019

(30) Foreign Application Priority Data

Mar. 29, 2019 (CN) .......................... 2019 1 0251308
Mar. 29, 2019 (CN) ..................... 2019 2 0434166 U

(51) Int. Cl.
| | | |
|---|---|---|
| *G06F 1/16* | (2006.01) | |
| *H05K 5/00* | (2006.01) | |
| *H05K 5/02* | (2006.01) | |
| *E05D 3/18* | (2006.01) | |
| *E05D 11/08* | (2006.01) | |
| *F16C 11/04* | (2006.01) | |

(52) U.S. Cl.
CPC ............ *G06F 1/1681* (2013.01); *E05D 3/18* (2013.01); *E05D 11/082* (2013.01); *F16C 11/04* (2013.01); *H05K 5/0017* (2013.01); *H05K 5/0226* (2013.01); *E05Y 2900/606* (2013.01); *G06F 1/1626* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,204,565 | B1 * | 12/2015 | Lee ........................... | E05D 7/00 |
| 9,600,035 | B2 * | 3/2017 | Park ...................... | G06F 1/1652 |
| 9,625,947 | B2 * | 4/2017 | Lee ........................ | H04M 1/022 |
| 9,870,031 | B2 * | 1/2018 | Hsu ....................... | G06F 1/1681 |
| 9,911,369 | B2 * | 3/2018 | Kim ........................ | G09F 9/301 |
| 9,915,981 | B2 * | 3/2018 | Hsu ....................... | G06F 1/1681 |
| 9,927,841 | B2 * | 3/2018 | Gheorghiu ............ | G06F 1/1652 |
| 10,037,058 | B2 * | 7/2018 | Kato ...................... | F16C 11/045 |
| 10,133,303 | B2 * | 11/2018 | Park ...................... | G06F 1/1616 |
| 10,209,743 | B1 * | 2/2019 | Hsu ................... | H05K 7/20954 |
| 10,401,917 | B1 * | 9/2019 | Dai ....................... | G06F 1/1652 |
| 10,420,233 | B2 * | 9/2019 | Lee ...................... | H05K 5/0017 |
| 10,423,019 | B1 * | 9/2019 | Song ................ | G02F 1/133305 |
| 2012/0044620 | A1 * | 2/2012 | Song ..................... | G06F 1/1616 |
| | | | | 361/679.01 |

(Continued)

*Primary Examiner* — Lisa Lea-Edmonds
(74) *Attorney, Agent, or Firm* — Birch, Stewart, Kolasch & Birch, LLP

(57) ABSTRACT

A flexible electronic device includes a flexible display, a support structure, and two hinge mechanisms. With the pivoting of first and second arm units of each hinge mechanism toward each other, a first inner arm is rotated with and moved relative to a first outer arm to bring a first support plate from a horizontal state to an upright state, and a second inner arm is rotated with and moved relative to a second outer arm to bring a second support plate from a horizontal state to an upright state so as to provide a leeway distance between the first and second inner arms and provide a leeway between the first and second support plate for the flexible display to be bendably received therein.

13 Claims, 29 Drawing Sheets

(56) References Cited

U.S. PATENT DOCUMENTS

| | | | |
|---|---|---|---|
| 2013/0021762 A1* | 1/2013 | van Dijk | G06F 1/1652 |
| | | | 361/749 |
| 2017/0365197 A1* | 12/2017 | Kim | G06F 1/1641 |
| 2018/0011515 A1* | 1/2018 | Yoo | G06F 1/1626 |
| 2018/0024589 A1* | 1/2018 | Nakamura | G06F 1/1616 |
| | | | 361/679.09 |
| 2018/0150112 A1* | 5/2018 | Aoki | G06F 1/1652 |
| 2018/0183911 A1* | 6/2018 | Lee | H04M 1/02 |
| 2018/0192527 A1* | 7/2018 | Yun | G06F 1/1652 |
| 2018/0329460 A1* | 11/2018 | Song | G06F 1/16 |
| 2019/0082544 A1* | 3/2019 | Park | H05K 5/0017 |
| 2019/0132432 A1* | 5/2019 | Park | H04M 1/0216 |
| 2019/0132947 A1* | 5/2019 | Koo | G02F 1/133305 |
| 2019/0173041 A1* | 6/2019 | Large | H01L 51/524 |
| 2019/0196541 A1* | 6/2019 | O'Neil | G06F 1/1616 |

\* cited by examiner

US 10,564,682 B1

HINGE MECHANISM AND FLEXIBLE ELECTRONIC DEVICE HAVING THE SAME

CROSS-REFERENCE TO RELATED APPLICATION

This application claims priority of Chinese Patent Application No. 201910251308.6, filed on Mar. 29, 2019, and priority of Chinese Patent Application No. 201920434166.2, filed on Mar. 29, 2019.

FIELD

The disclosure relates to a hinge mechanism, and more particularly to a hinge mechanism for a flexible electronic device and a flexible electronic device having the same.

BACKGROUND

A conventional consumer electronic device with flexible display technology generally has two substrates for mounting a flexible display thereon, and at least one hinge mechanism disposed between the substrates to permit rotation of the substrates so as to fold and unfold the flexible display. When the flexible display is folded, an additional receiving space within the hinge mechanism is required for receiving a bending portion of the flexible display to prevent damage to the flexible display.

SUMMARY

Therefore, an object of the disclosure is to provide a hinge mechanism and a flexible electronic device that can alleviate at least one of the drawbacks of the prior art.

According to one aspect of the disclosure, the hinge mechanism includes a cam, a first arm unit and a second arm unit. The cam extends in a lengthwise direction to terminate at two peripheral cam surface sections, and has two first pivot holes which are spaced apart from each other in the lengthwise direction, and two second pivot holes each of which is spaced apart from a respective one of the first pivot holes in a height direction that is transverse to the lengthwise direction.

The first arm unit includes a first outer arm, a first inner arm and a first connecting member. The first outer arm has first proximate and distal ends relative to the cam. The first proximate end has a first accommodation chamber, a first outer pivot section which is formed in the first accommodation chamber and journalled to one of the first pivot holes, and a first outer connecting section which is formed in the first accommodation chamber and spaced apart from the first outer pivot section. The first inner arm is disposed in the first accommodation chamber, and has a first pivot end portion which extends toward the cam, and a cam follower which is configured to be slidably engaged with one of the peripheral cam surface sections. The first pivot end portion has a first inner pivot section which is journalled to one of the second pivot holes, and a first inner connecting section which is spaced apart from the first inner pivot section. The first connecting member has two opposite ends respectively connected to the first outer connecting section and the first inner connecting section, and is configured such that a first line passing through the first outer pivot section and the first outer connecting section is parallel to a second line passing through the first inner pivot section and the first inner connecting section.

The second arm unit includes a second outer arm, a second inner arm and a second connecting member. The second outer arm has second proximate and distal ends relative to the cam. The second proximate end has a second accommodation chamber, a second outer pivot section which is formed in the second accommodation chamber and journalled to the other one of the first pivot holes, and a second outer connecting section which is formed in the second accommodation chamber and spaced apart from the second outer pivot section. The second inner arm is disposed in the second accommodation chamber, and has a second pivot end portion which extends toward the cam, and a cam follower which is configured to be slidably engaged with the other one of the peripheral cam surface sections. The second pivot end portion has a second inner pivot section which is journalled to the other one of the second pivot holes, and a second inner connecting section which is spaced apart from the second inner pivot section. The second connecting member has two opposite ends respectively connected to the second outer connecting section and the second inner connecting section, and is configured such that a third line passing through the second outer pivot section and the second outer connecting section is parallel to a fourth line passing through the second inner pivot section and the second inner connecting section.

The first and second arm units are pivotable relative to each other between an unfolded position, where the first and second distal ends are remote from each other to have the first and second outer arms extending parallel to each other along the lengthwise direction, and a folded position, where the first and second distal ends are close to each other and have the first and second outer arms extending in the height direction. During the pivoting of the first and second arm units from the unfolded position to the folded position, the first inner arm is rotated with the first outer arm through the first connecting member, and is moved relative to the first outer arm from a proximate position, where the first inner arm is proximate to a top side of the first accommodation chamber, to a distal position, where the first inner arm is proximate to a bottom side of the first accommodation chamber, and the second inner arm is rotated with the second outer arm through the second connecting member, and is moved relative to the second outer arm from a proximate position, where the second inner arm is proximate to a top side of the second accommodation chamber, to a distal position, where the second inner arm is proximate to a bottom side of the second accommodation chamber so as to provide a leeway distance between the first and second inner arms.

According to another aspect of the disclosure, the flexible electronic device includes a flexible display, a support structure, and two of the hinge mechanisms described above. The support structure includes a base seat and first and second substrate units disposed above the base seat. The first substrate unit has a first support plate which is disposed adjacent to and rotatable relative to the base seat, and a first substrate plate which is connected and adjoined to the first support plate. The second substrate unit is disposed opposite to the first substrate unit in the lengthwise direction, and has a second support plate which is disposed adjacent to and rotatable relative to the base seat, and a second substrate plate which is connected and adjoined to the first support plate.

The first and second substrate plates are coplanar to cooperatively define a display supporting surface for the flexible display to be attached thereto. The first and second support plates are coplanar to cooperatively define a carrying surface for a bending portion of the flexible display to be attached thereto. The hinge mechanisms are disposed between the first and second substrate units and opposite to each other in the width direction. The first arm unit is disposed for the first substrate unit to be mounted thereon. The second arm unit is disposed for the second substrate unit to be mounted thereon. During the pivoting of the first and second arm units from the unfolded position to the folded position, the first inner arm is rotated with and moved relative to the first outer arm from the proximate position, where the first inner arm is proximate to the top side of the first accommodation chamber to bring the first support plate in a horizontal state, to the distal position, where the first inner arm is proximate to the bottom side of the first accommodation chamber to bring the first support plate in an upright state, and the second inner arm is rotated with and moved relative to the second outer arm from the proximate position, where the second inner arm is proximate to the top side of the second accommodation chamber to bring the second support plate in a horizontal state, to a distal position, where the second inner arm is proximate to the bottom side of the second accommodation chamber to bring the second support plate in an upright state so as to provide the leeway distance between the first and second inner arms and provide a leeway between the first and second support plates for the flexible display to be bendably received therein.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
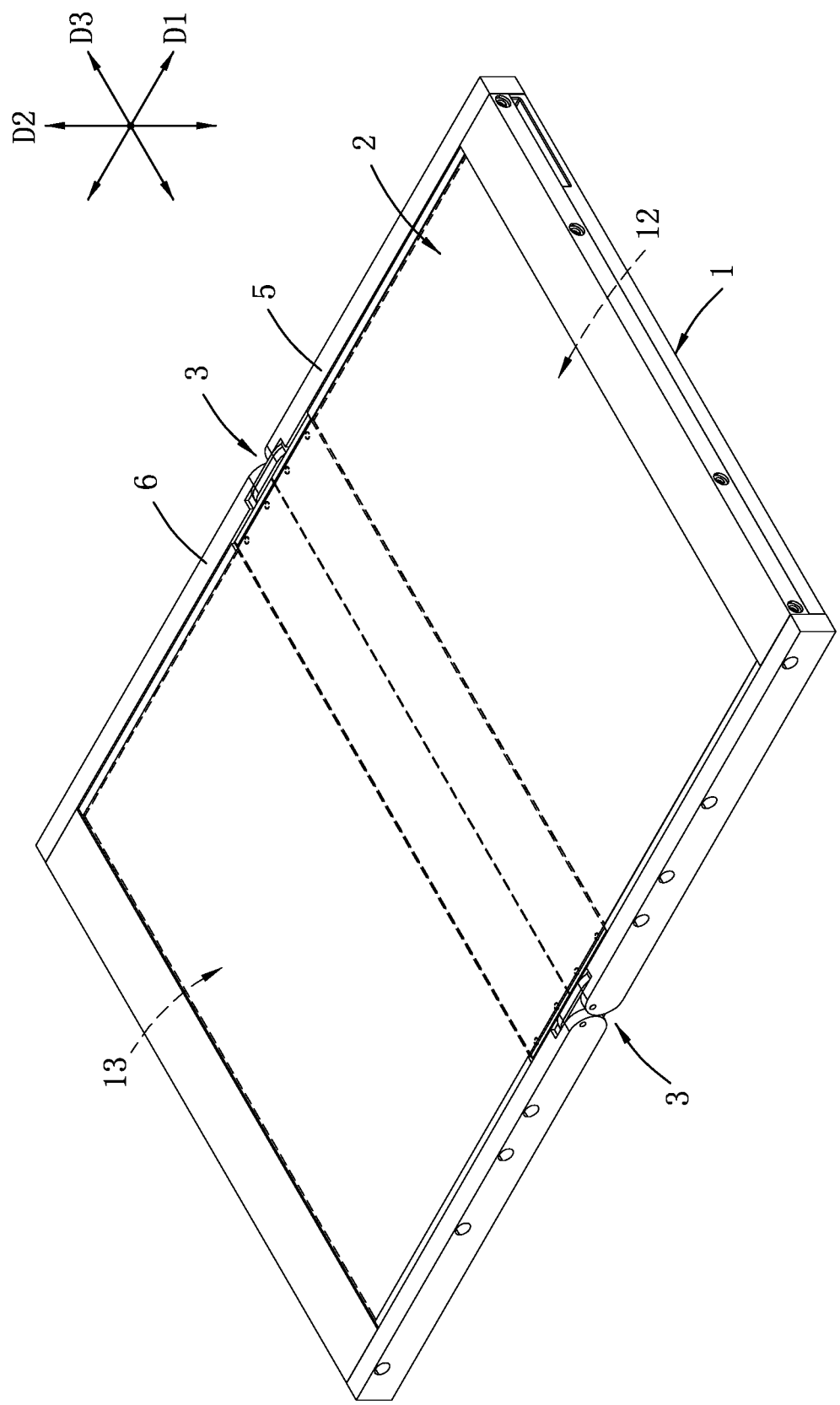
FIG. 1 is a perspective view illustrating an embodiment of a flexible electronic device according to the disclosure in an unfolded state.
Figure 2:
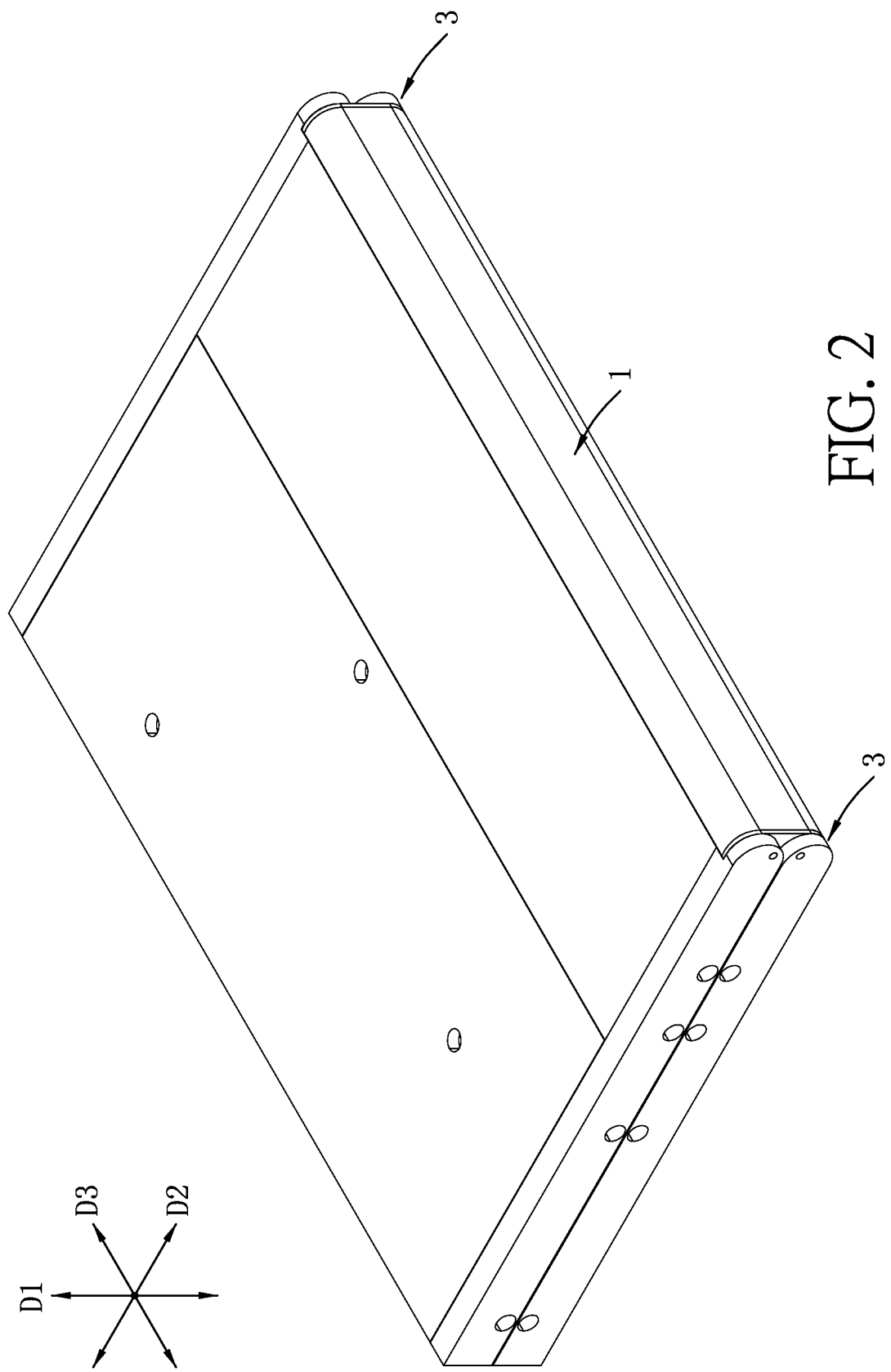
FIG. 2 is a perspective view of the embodiment in a folded state.

Referring to FIGS. 1 and 2, an embodiment of a flexible electronic device according to the disclosure includes a support structure 1, a flexible display 2 and two hinge mechanisms 3. In this embodiment, the flexible electronic device is a tablet PC having the flexible display 2 attached to an upper surface of the support structure 1. The hinge mechanisms 3 are disposed at two opposite sides of the support structure 1 to permit the flexible electronic device to be angularly positioned and to be operable at a desired state, which ranges between an unfolded state (as shown in FIG. 1) and a folded state (as shown in FIG. 2). In the folded state, the hinge mechanisms 3 provide a bending space for receiving a bending portion of the flexible display 2 to prevent damage to the flexible display 2. In other embodiments, the flexible electronic device may be a mobile phone, a portable PC, and so forth which have the flexible display 2.

To aid in describing the disclosure, directional terms may be used in the specification and claims to describe portions of the present disclosure (e.g., lengthwise, height, width, upper, lower, top, bottom, etc.). These directional definitions are intended to merely assist in describing and claiming the disclosure and are not intended to limit the disclosure in any way.

Figure 3:
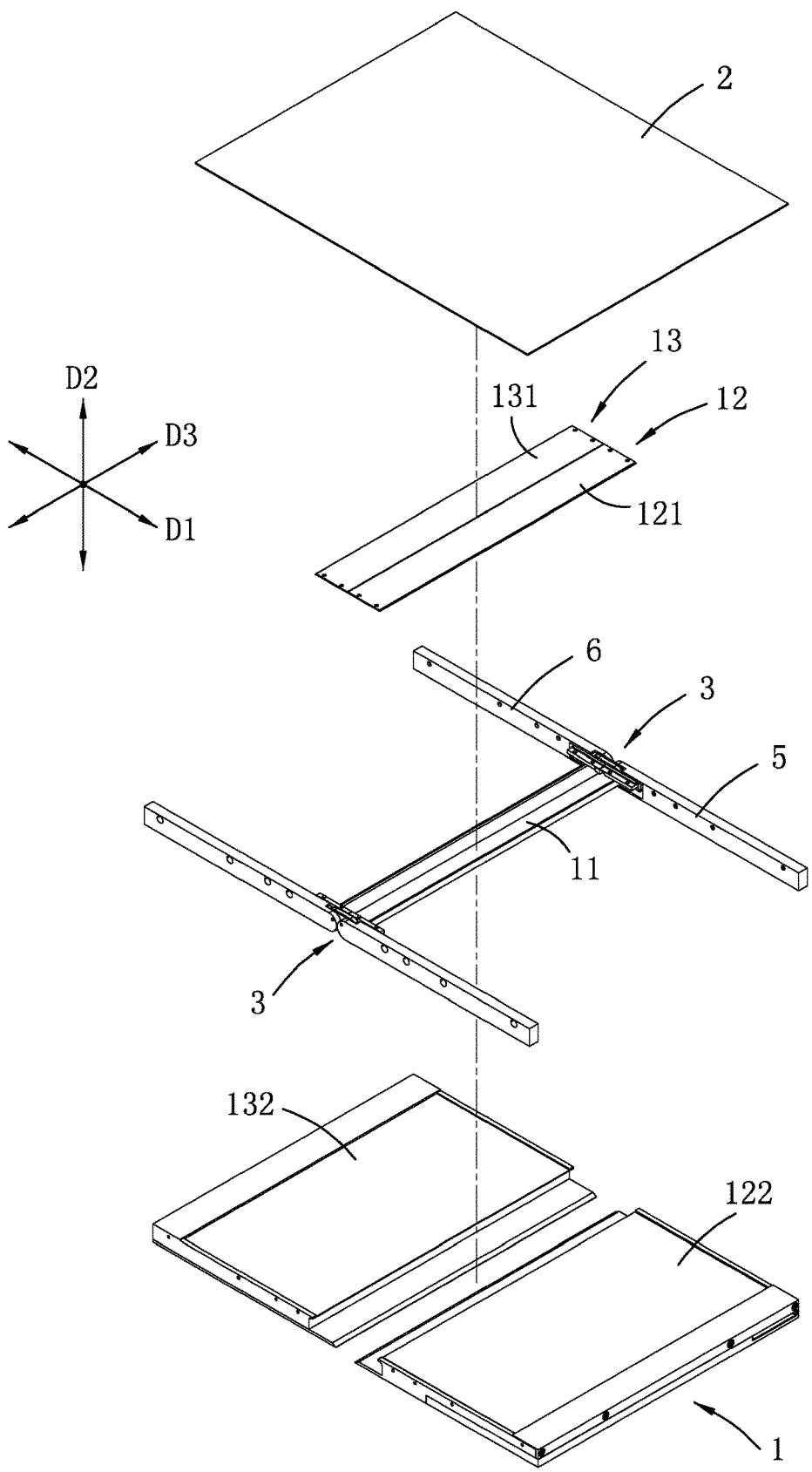
FIG. 3 is an exploded perspective view of the embodiment.

With reference to FIGS. 1 and 3, the support structure 1 is for holding and supporting the flexible display 2, and includes a base seat 11, a first substrate unit 12 and a second substrate unit 13. In the unfolded state, the first and second substrate units 12, 13 are adjacent to each other to have upper major surfaces thereof coplanar with each other for the flexible display 2 to be attached thereto.

Figure 4:
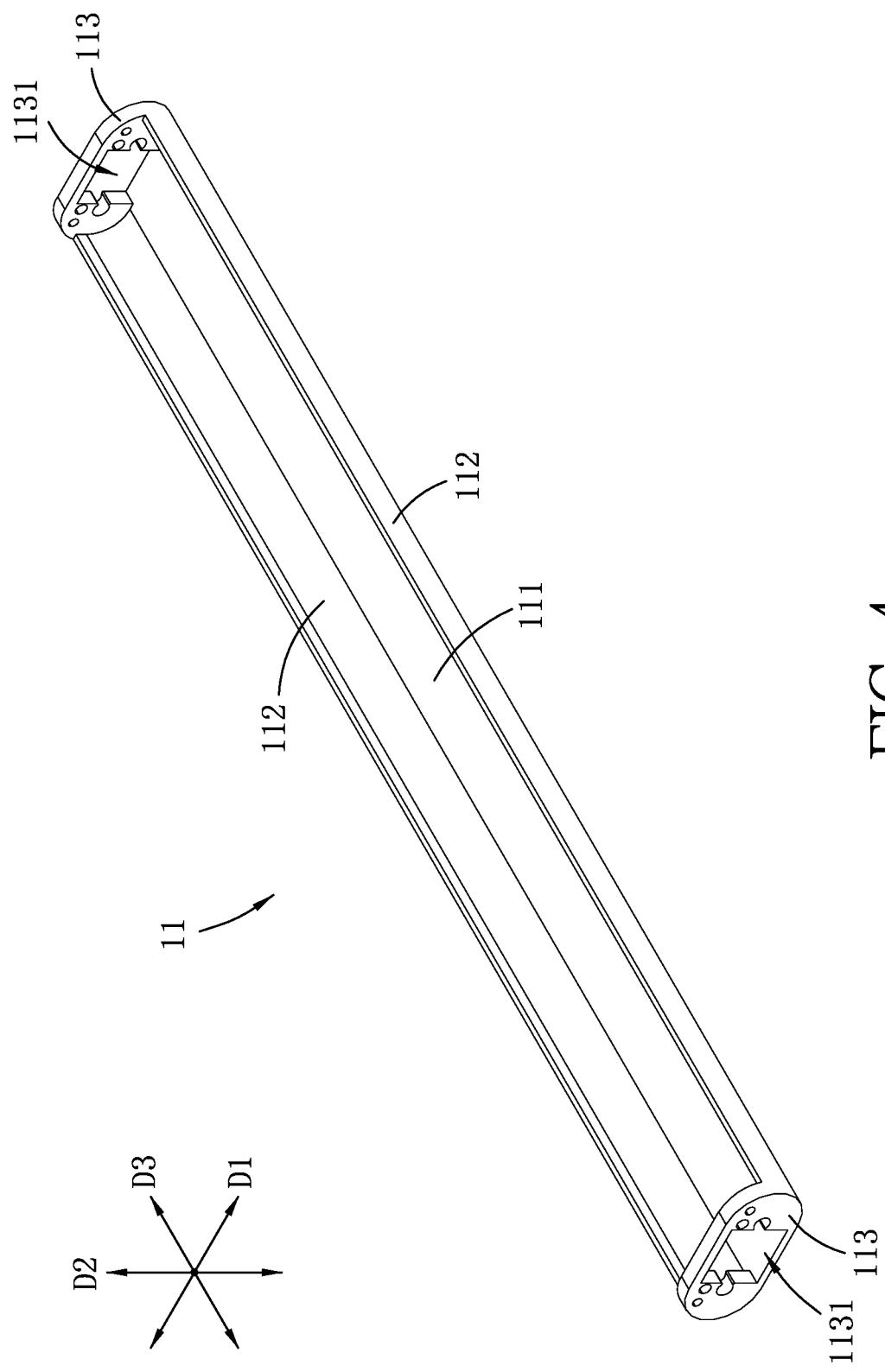
FIG. 4 is a perspective view of a base seat of the embodiment.

With reference to FIGS. 3 and 4, the base seat 11 has a base wall 111, two long walls 112 and two short walls 113. The base wall 111 is elongated along a width direction (D3). The long walls 112 extend respectively and upwardly from two long side edges of the base wall 111, and the short walls 113 extend respectively and upwardly from two short side edges of the base wall 111 to connect with the long walls 112. Each short wall 113 is formed with a penetrating hole 1131.

The first substrate unit 12 is disposed above the base seat 11, and has a first support plate 121 which is disposed adjacent to and rotatable relative to the base seat 11, and a first substrate plate 122 which is connected and adjoined to the first support plate 121. The second substrate unit 13 is disposed above the base seat 11 and opposite to the first substrate unit 12 in a lengthwise direction (D1) that is transverse to the width direction (D3), and has a second support plate 131 which is disposed adjacent to and rotatable relative to the base seat 11, and a second substrate plate 132 which is connected and adjoined to the first support plate 131. In this embodiment, the first and second support plates 121, 131 are disposed adjacent to side edges of the long walls 112, respectively. In the unfolded state, the first and second substrate plates 122, 132 are disposed adjacent to the long walls 112, respectively, and have coplanar upper major surfaces that cooperatively define a display supporting surface for the flexible display 2 to be attached thereto. Also, upper major surfaces of the first and second support plates 121, 131 are coplanar and adjoined to each other to cooperatively define a carrying surface for a bending portion of the flexible display 2 to be attached thereto.

Figure 5:
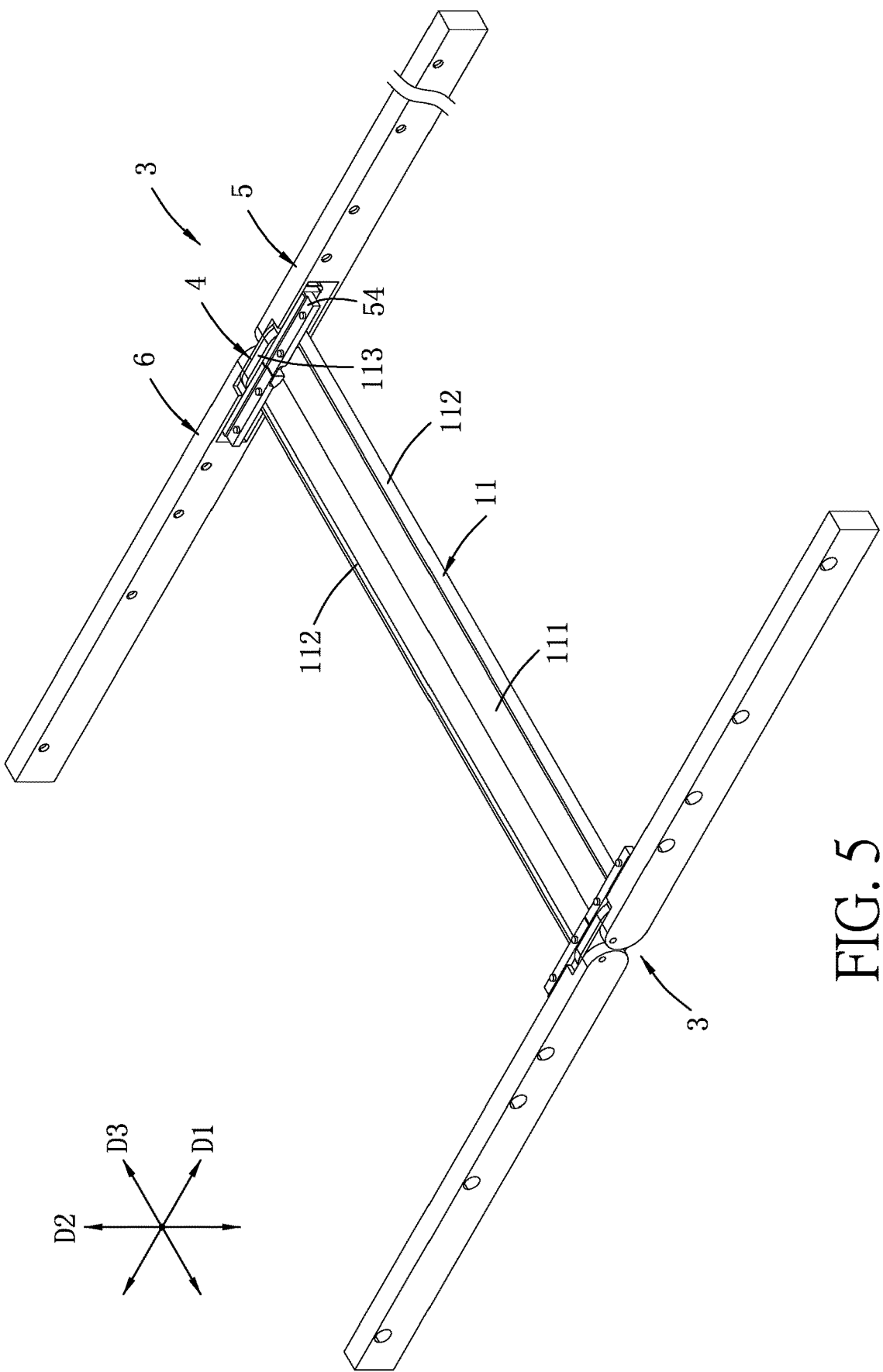
FIG. 5 is a perspective view of the base seat and two hinge mechanisms of the embodiment.
Figure 6:
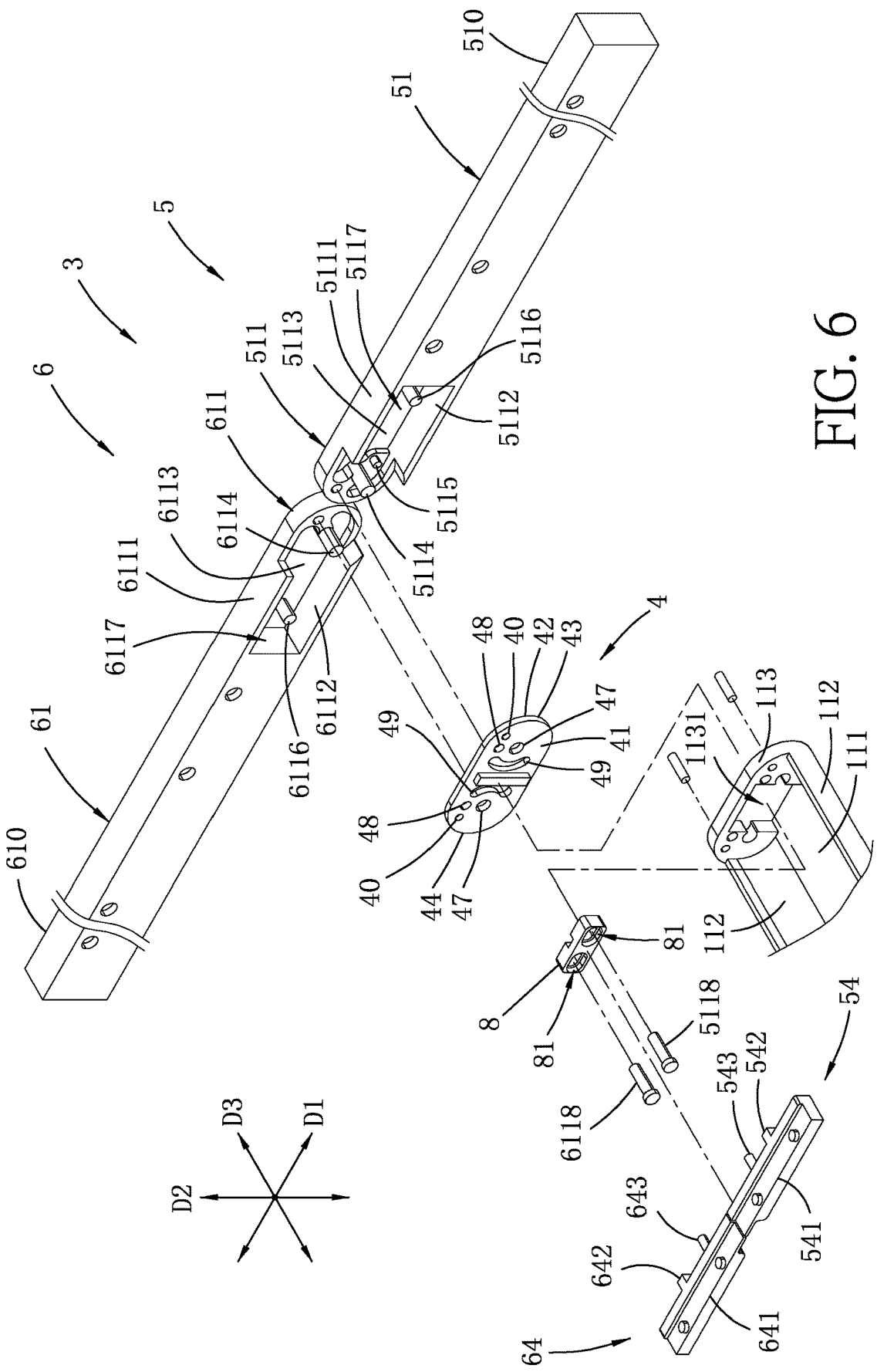
FIG. 6 is an exploded, fragmentary perspective view of a portion of the base seat and one of the hinge mechanisms.
Figure 7:
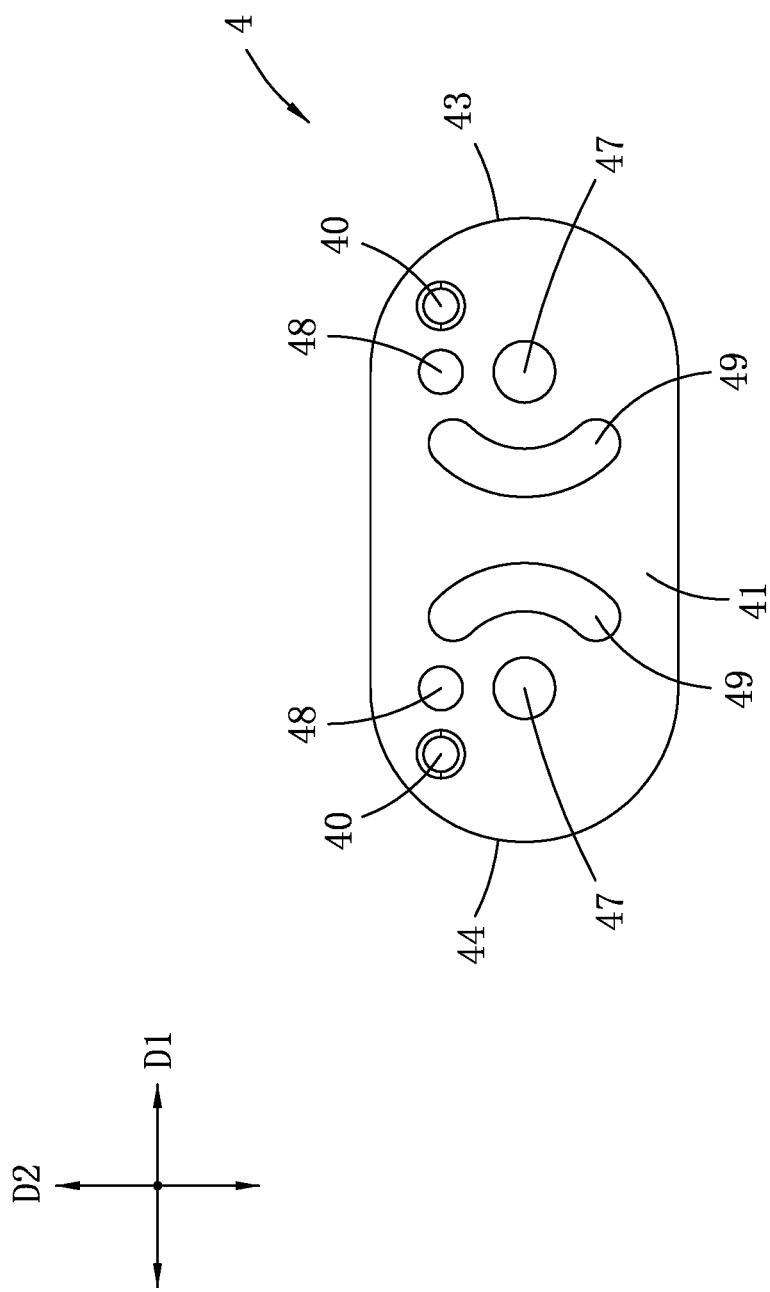
FIG. 7 is a front view of a cam of the hinge mechanism.

Referring to FIGS. 3 to 5, in this embodiment, the hinge mechanisms 3 are symmetrically disposed between the first and second substrate units 12, 13 and opposite to each other in the width direction (D3). Each of the hinge mechanisms 3 is connected to the first and second substrate units 12, 13, and includes a cam 4, a first arm unit 5 and a second arm unit 6. With reference to FIGS. 6 and 7, the cam 4 is disposed outboard of a corresponding one of the short walls 113, and the first and second arm units 5, 6 are disposed outwardly of an outer major surface 42 of the cam 4 that faces away from the corresponding short wall 113, and are symmetrically disposed at two sides of the cam 4.

Referring to FIGS. 6 and 7, the cam 4 extends in the lengthwise direction (D1) to terminate at two arcuate peripheral cam surface sections 43, 44, and has two first pivot holes 47 which are spaced apart from each other in the lengthwise direction (D1), two second pivot holes 48 each of which is spaced apart from a respective one of the first pivot holes 47 in a height direction (D2) that is transverse to both the lengthwise direction (D1) and the width direction (D3), two arcuate slots 49 which are formed between the first pivot holes 47 in terms of the lengthwise direction (D1) and spaced apart from each other in the lengthwise direction (D1), and two positioning holes 40 which are formed adjacent to the peripheral cam surface sections 43, 44, respectively, and spaced apart from the second pivot holes 48 in the lengthwise direction (D1). Each of the peripheral cam surface sections 43, 44 and the arcuate slots 49 angularly extends about a respective one of the first pivot holes 47. The cam 4 has an inner major surface 41 opposite to the outer major surface 42 in the width direction (D3) and abutting against the corresponding short wall 113 such that the first and second pivot holes 47, 48 and the arcuate slots 49 are aligned and communicated with the penetrating hole 1131.

Figure 8:
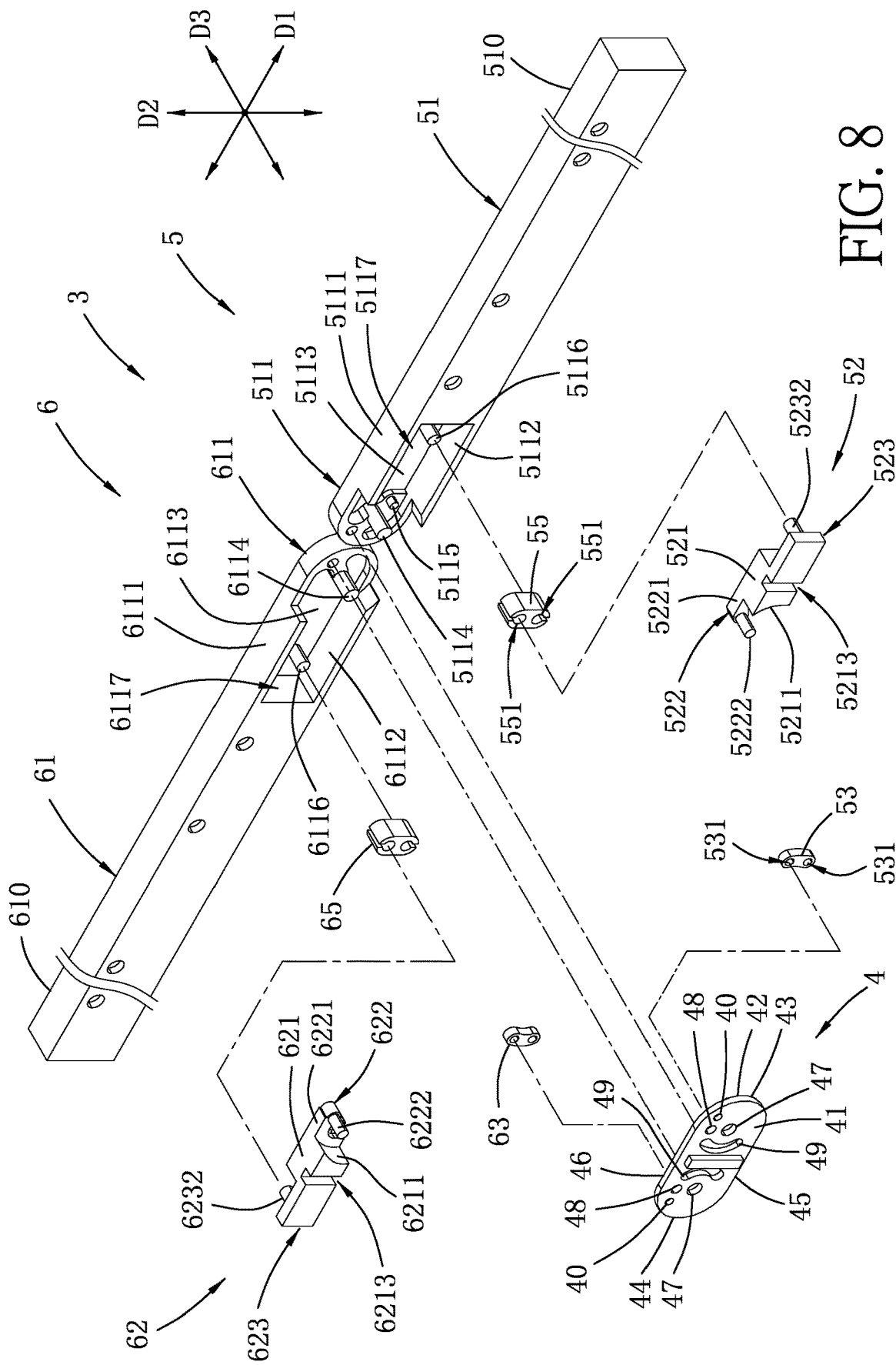
FIG. 8 is an exploded, fragmentary perspective view of a portion of the hinge mechanism, further illustrating first and second inner arms and first and second friction increasing members thereof.

Referring to FIGS. 3, 6 and 8, the first arm unit 5 includes a first outer arm 51, a first inner arm 52, a first connecting member 53, a first support bracket 54 and a first friction increasing member 55. In this embodiment, the first outer arm 51 abuts against and is fastened to a side edge of the first substrate plate 122 by means of screws. The first inner arm 52 is connected with the first support bracket 54. The first support bracket 54 is fastened to a side portion of the first support plate 121 by means of screws. Each of the first connecting member 53 and the first friction increasing member 55 has two opposite ends respectively connected to the first outer arm 51 and the first inner arm 52.

Specifically, with reference to FIGS. 6 and 8, the first outer arm 51 has first proximate and distal ends 511, 510 relative to the cam 4. The first proximate end 511 has a first upper wall 5111, a first lower wall 5112 spaced apart from the first upper wall 5111 in the height direction (D2), and a first side wall 5113 extending in the height direction (D2) for interconnecting the first upper and lower walls 5111, 5112 to cooperatively define a first accommodation chamber 5117 that has an access opening opposite to the first side wall 5113 in the width direction (D3).

Figure 14:
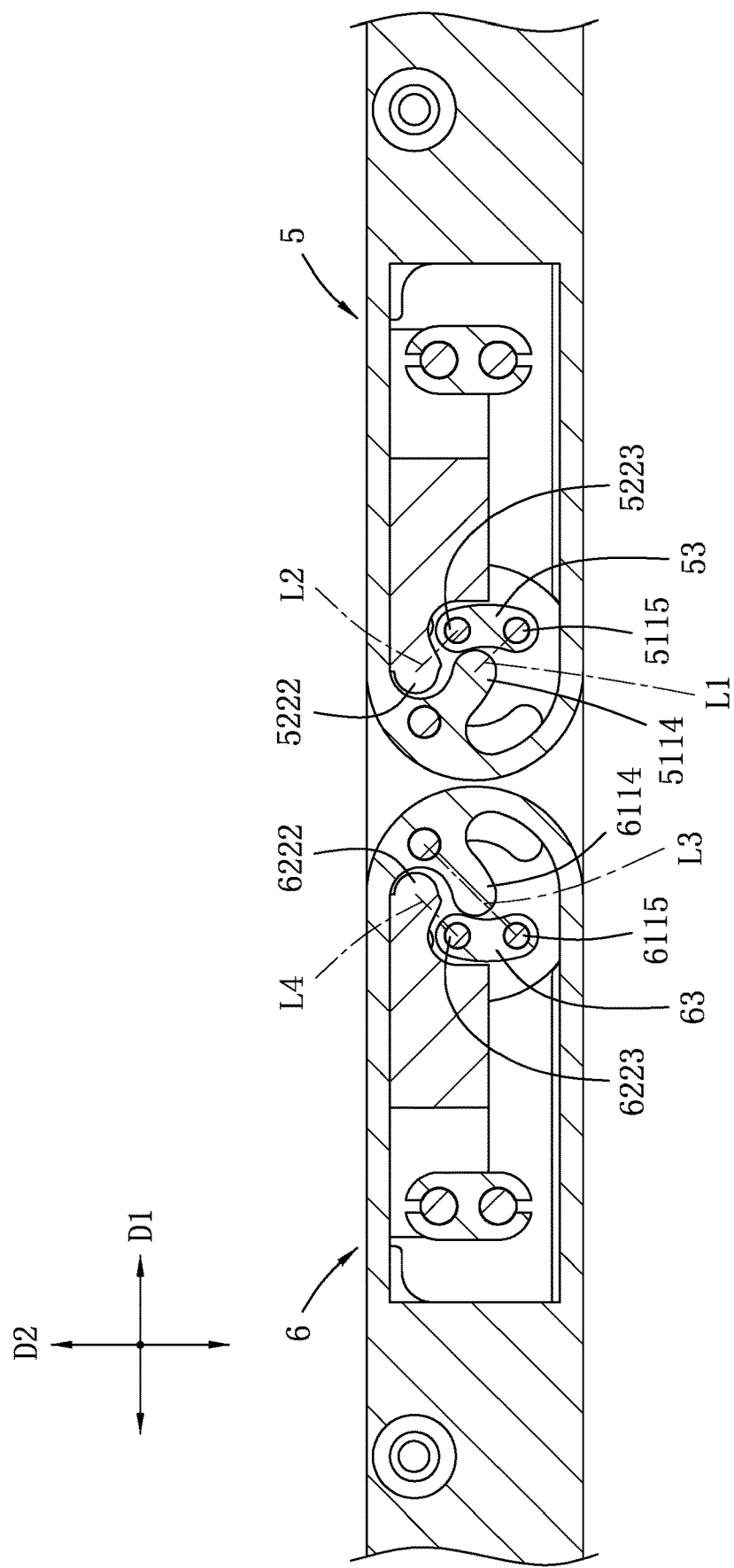
FIGS. 14 and 15 are fragmentary sectional views taken along line XIV-XIV of FIG. 11.
Figure 15:
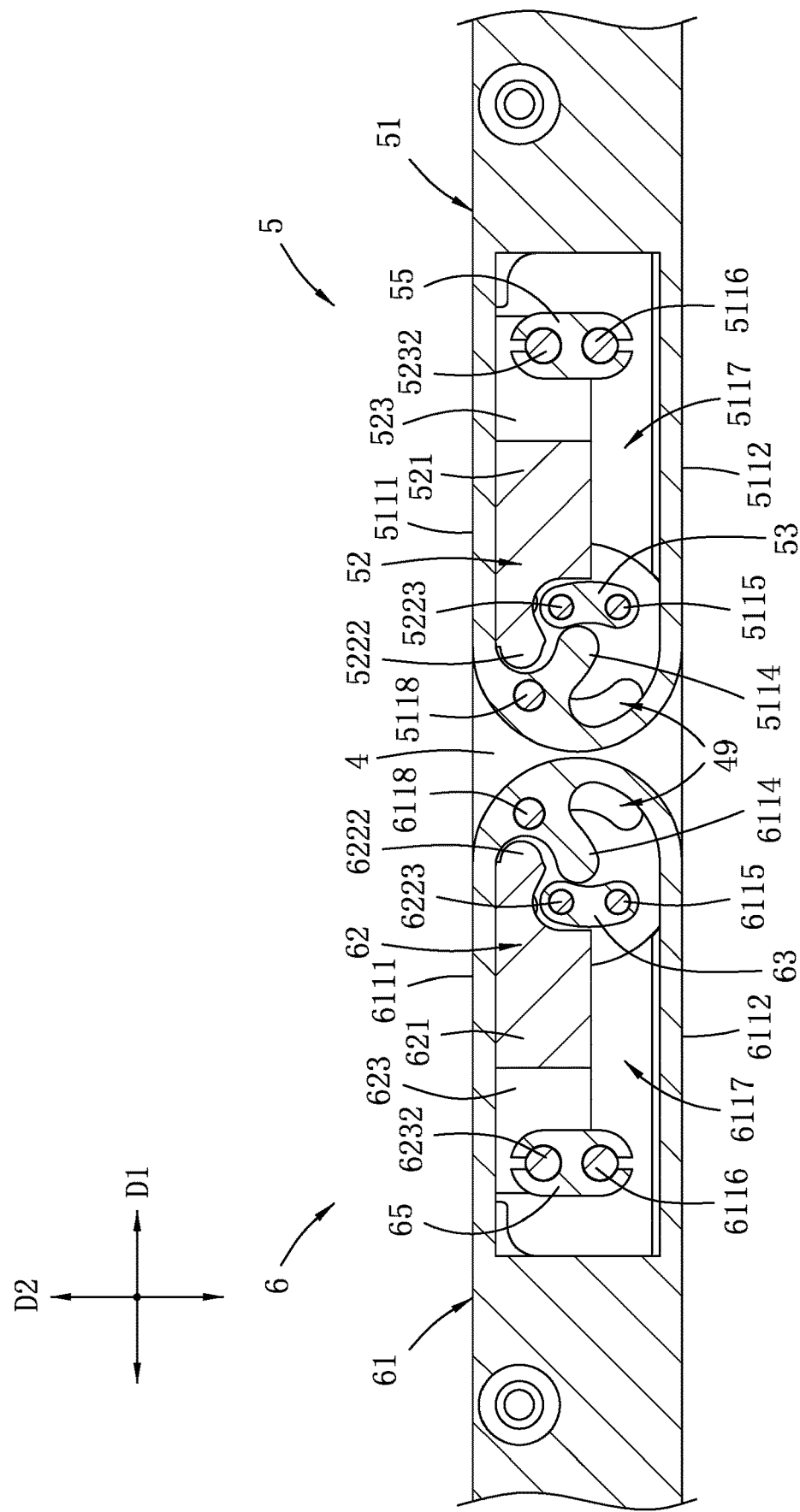
Figure 16:
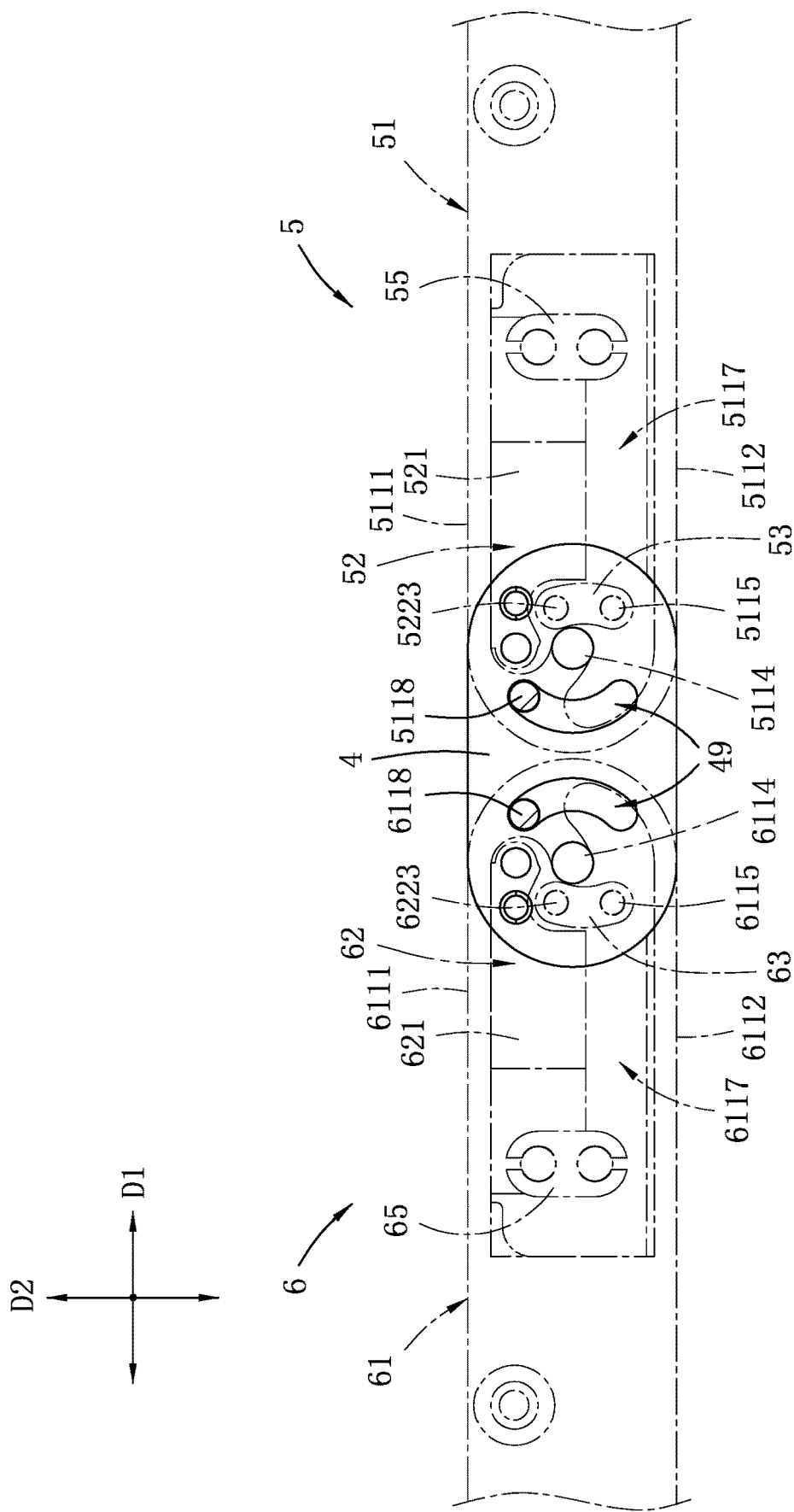
FIG. 16 is a fragmentary sectional view similar to FIG. 14, illustrating outer pivot and sliding sections of first and second arm units of the hinge mechanism.
Figure 17:
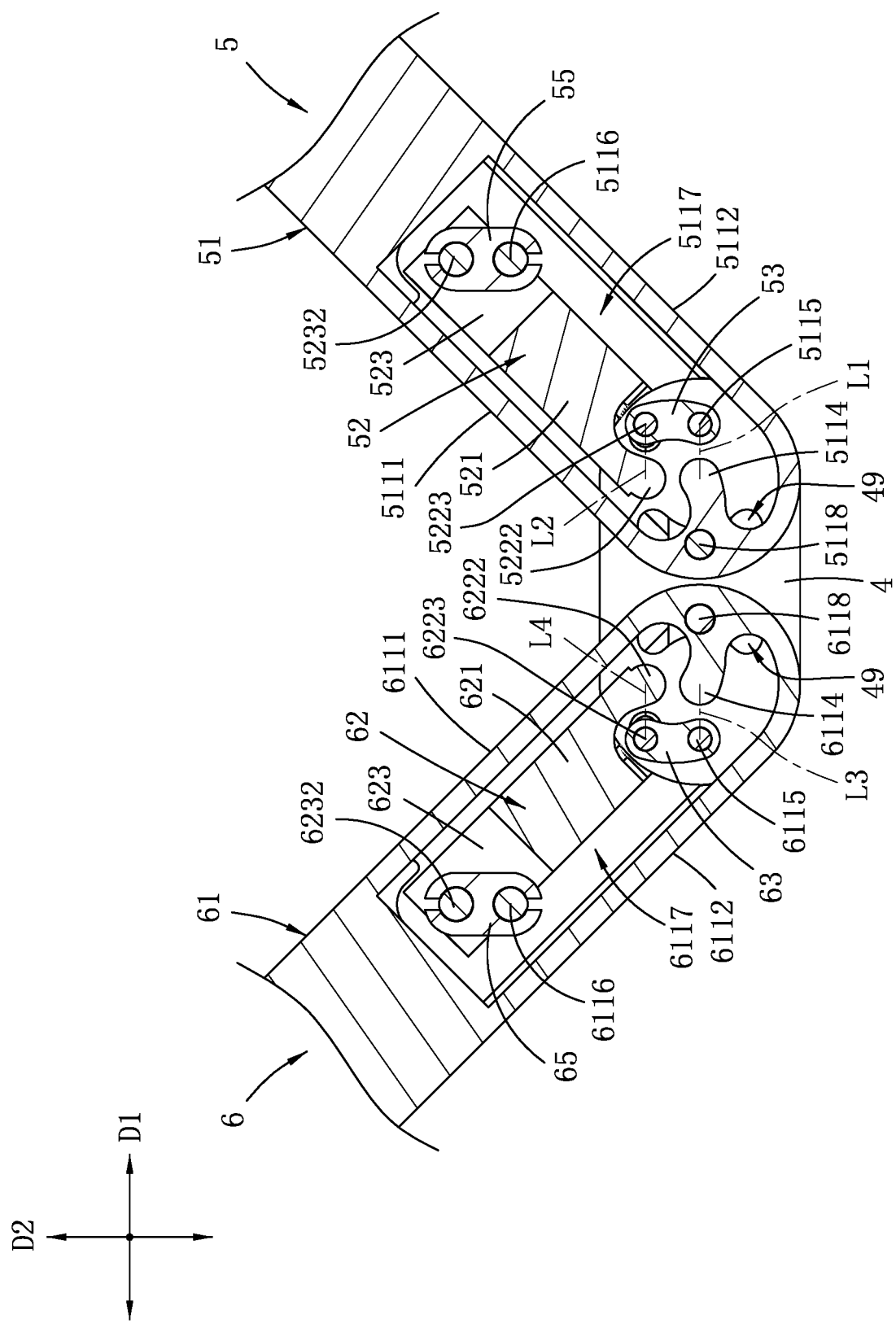
FIGS. 17 and 18 are fragmentary sectional views taken along line XVII-XVII of FIG. 12.
Figure 18:
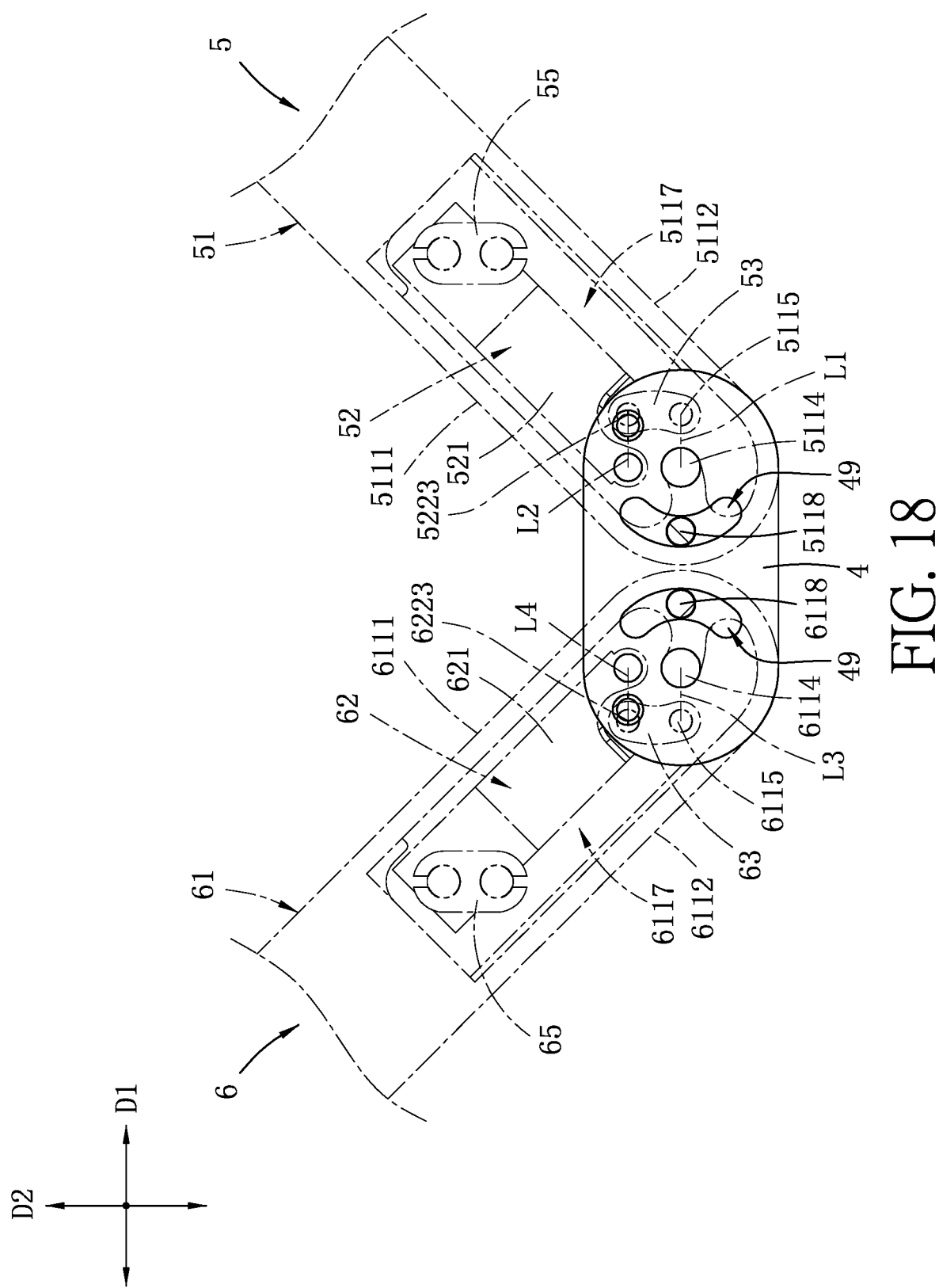
Figure 19:
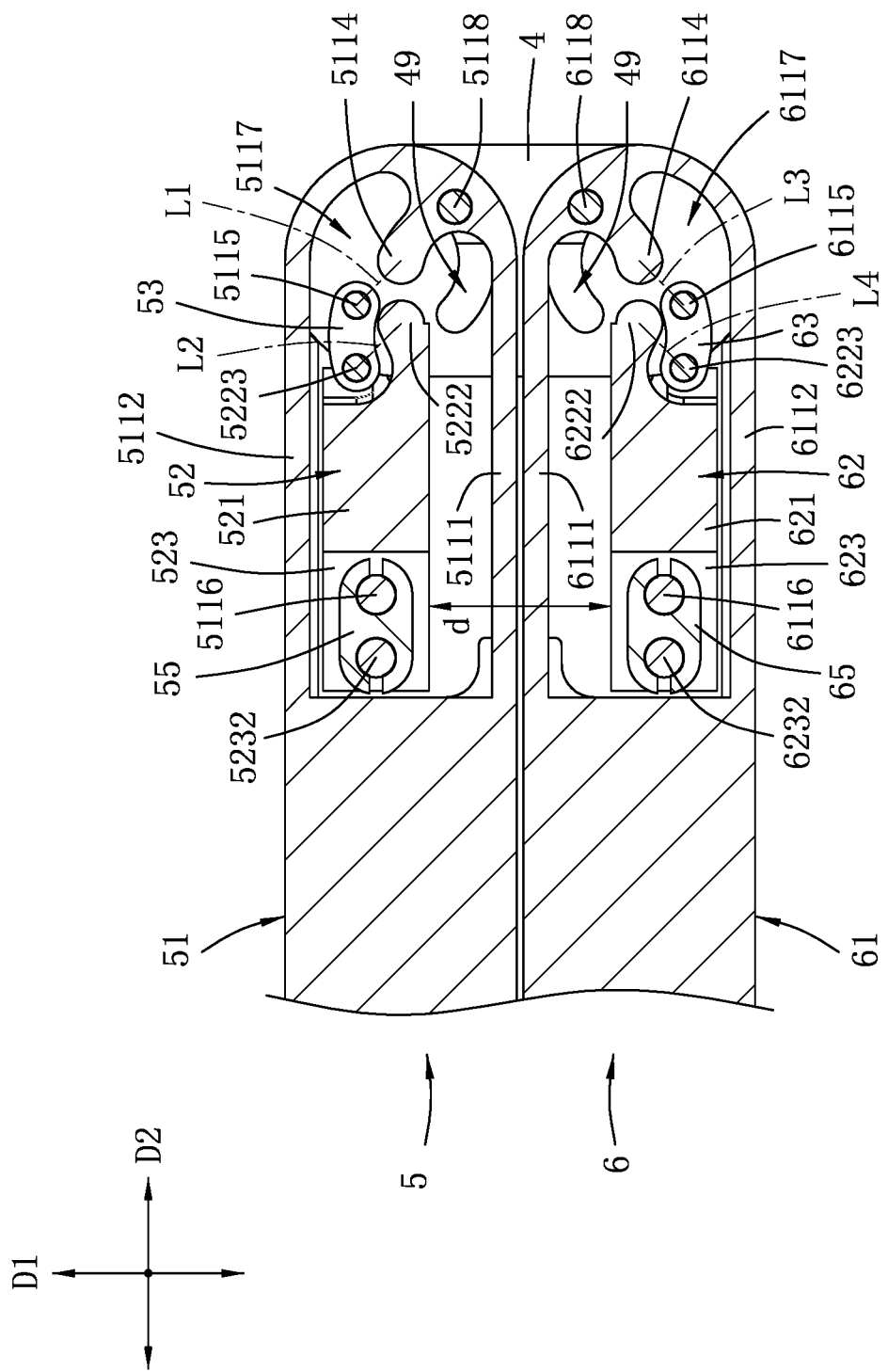
FIGS. 19 and 20 are fragmentary sectional views taken along line XIX-XIX of FIG. 13.
Figure 20:
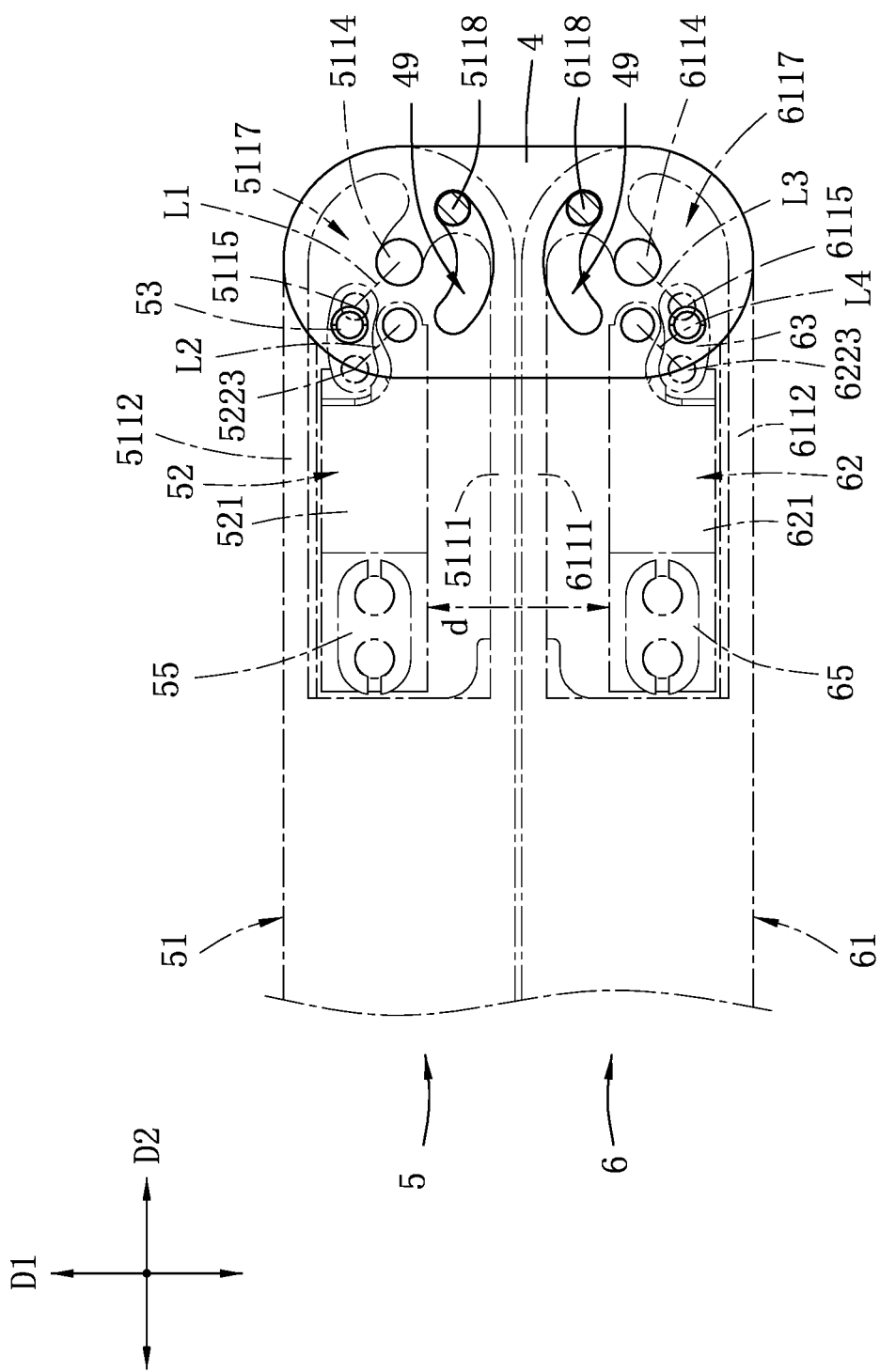

The first accommodation chamber 5117 is formed with a first outer pivot section 5114, a first outer connecting section 5115, and a first friction connecting section 5116, each of which is spaced apart from each other, is in the form of a shaft, and has an end connected to the first side wall 5113 and extends in the width direction (D3). The first outer pivot section 5114 is journalled to one of the first pivot holes 47 to further extend through the short wall 113. As shown in FIG. 14, in an unfolded position, the first outer connecting section 5115 is disposed lower than the first outer pivot section 5114. The first friction connecting section 5116 is remote from the cam 4.

Figure 9:
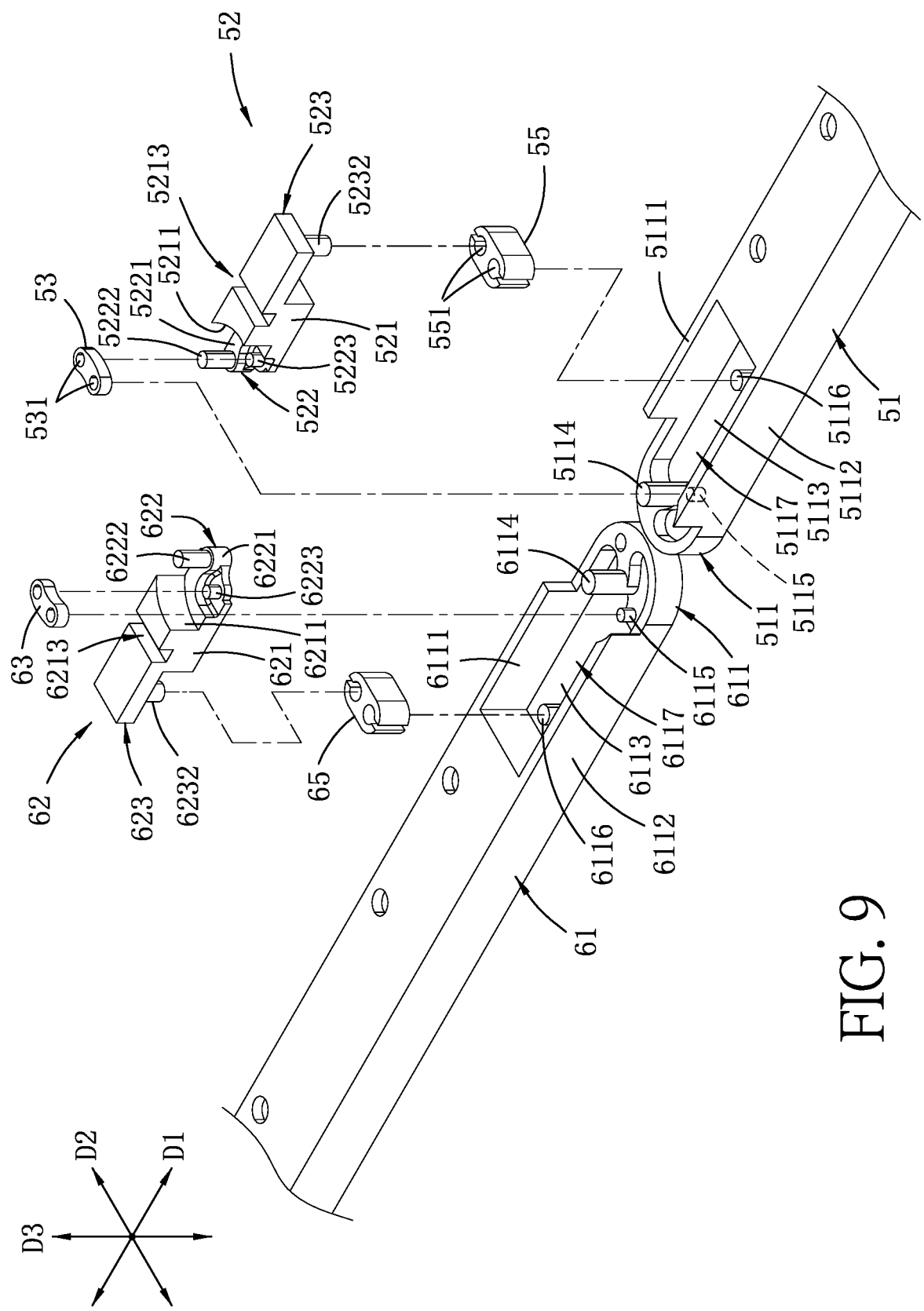
FIG. 9 is another exploded, fragmentary perspective view of the portion of the hinge mechanism.

Referring to FIGS. 6, 8 and 9, the first inner arm 52 is disposed in the first accommodation chamber 5117, and has first pivot and connect end portions 522, 523 which extend toward and away from the cam 4, respectively, and an arm body 521 interposed therebetween. The arm body 521 has a cam follower 5211 which is configured to be slidably engaged with one of the arcuate peripheral cam surface sections 43, and a first retaining slot 5213 facing away from the first outer arm 51. The first pivot end portion 522 has an end wall body 5221 which extends from the cam follower 5211 in the lengthwise direction (D1) toward the cam 4, a first inner pivot section 5222 in the form of a shaft which has an end connected to the end wall body 5221 and which extends in the width direction (D3) to be journalled to one of the second pivot holes 48, and a first inner connecting section 5223 in the form of a shaft which has an end connected to the end wall body 5221 and which extends in the width direction (D3). As shown in FIG. 14, in the unfolded position, the first inner connecting section 5223 is disposed above the first outer connecting section 5115 and between the first inner and outer pivot sections 5222, 5114 in terms of the height direction (D2). The first connect end portion 523 has a first connecting end 5232 in the form of a shaft extending toward the first outer arm 51. The first connecting end 5232 is spaced apart from the first friction connecting section 5116 in terms of the height direction (D2).

Referring to FIGS. 8 and 9, the first connecting member 53 is curvedly configured to have two opposite ends formed with bores 531 which are respectively connected to the first outer connecting section 5115 and the first inner connecting section 5223, such that the first outer and inner arms 51, 52 are parallel to each other.

Figure 10:
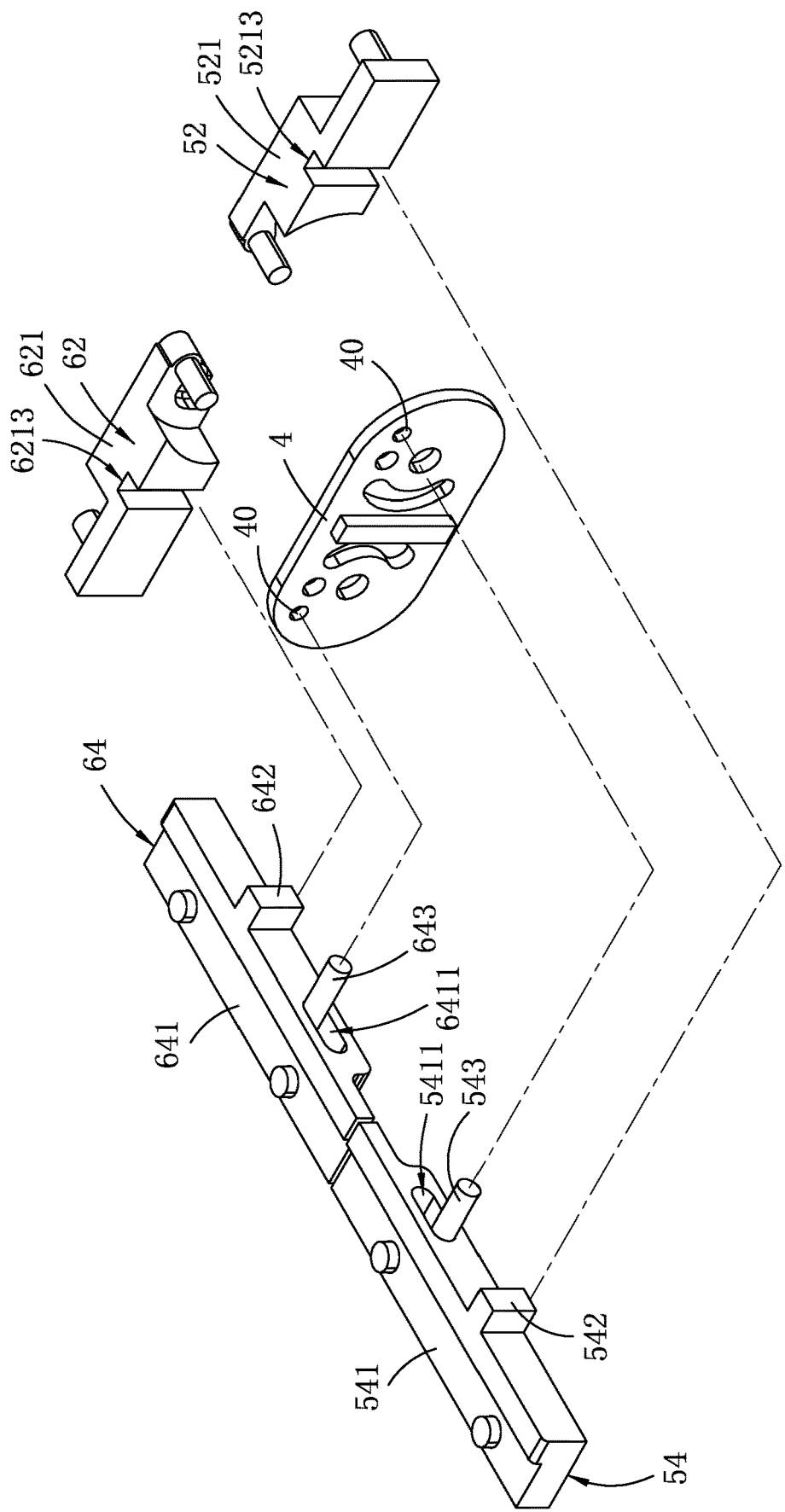
FIG. 10 is an exploded perspective view of a portion of the hinge mechanism.

Referring to FIGS. 6 and 10, the first support bracket 54 and the cam 4 are respectively disposed on two opposite sides of the short wall 113. The first support bracket 54 substantially extends in the lengthwise direction (D1), and has an upper wall 541 securely connected to a side portion of the first support plate 121 (see FIG. 3), and a first retaining protrusion 542 slidably engaged in the first retaining slot 5213 to permit movement of the first support bracket 54 with the first inner arm 52. Additionally, the first support bracket 54 has an elongated slot 5411 extending in the lengthwise direction (D1) and aligned with one of the positioning holes 40 of the cam 4 such that a positioning shaft 543 extends in the width direction (D3) to have two ends respectively engaged in the elongated slot 5411 and the positioning hole 40 through the short wall 113.

Referring to FIG. 8, the first friction increasing member 55 has two penetrating holes 551 formed in two ends and respectively and rotatably connected to the first connecting end 5232 of the first inner arm 52 and first friction connecting section 5116 of the first outer arm 51 so as to provide a friction to angularly position the first arm unit 5.

It should be noted that, structural components of the first and second arm units 5, 6 are symmetrically identical. Therefore, some details related to the second arm unit 6 are omitted for the sake of brevity. However, such details can be easily recognized by inferring to their respective counterparts in the first arm unit. Referring again to FIGS. 6 to 10, the second arm unit 6 and the first arm unit 5 are symmetrically disposed at two sides of the cam 4. Similar to the first arm unit 5, the second arm unit 6 includes a second outer arm 61, a second inner arm 62, a second connecting member 63, a second support bracket 64 and a second friction increasing member 65.

The second outer arm 61 has second proximate and distal ends 611, 610 relative to the cam 4. The second proximate end 611 has a second upper wall 6111, a second lower wall 6112 spaced apart from the second upper wall 6111 in the height direction (D2), and a second side wall 6113 extending in the height direction (D2) to interconnect the second upper and lower walls 6111, 6112 to cooperatively define a second accommodation chamber 6117 that has an access opening opposite to the second side wall 6113 in the width direction (D3). A second outer pivot section 6114, a second outer connecting section 6115 (see FIG. 9) and a second friction connecting section 6116, each in the form of a shaft, are formed in the second accommodation chamber 6117, are connected to the second side wall 5113 and extend in the width direction (D3). The second outer pivot section 6114 is journalled to the other one of the first pivot holes 47. As shown in FIG. 14, in an unfolded position, the second outer connecting section 6115 is disposed lower than the second outer pivot section 6114.

The second inner arm 62 is disposed in the second accommodation chamber 6117, and has second pivot and connect end portions 622, 623 which extend toward and away from the cam 4, respectively, and an arm body 621 interposed therebetween. The arm body 621 has a cam follower 6211 which is configured to be slidably engaged with the other one of the arcuate peripheral cam surface sections 43, and a second retaining slot 6213 facing away from the second outer arm 61. The second pivot end portion 622 has a second inner pivot section 6222 and a second inner connecting section 6223 each in the form of a shaft which has an end connected to an end wall body 6221 of the second pivot end portion 622 and which extends in the width direction (D3). The second inner pivot section 6222 is journalled to the other one of the second pivot holes 48. As shown in FIG. 14, in the unfolded position, the second inner connecting section 6223 is disposed above the second outer connecting section 6115 and between the second inner and outer pivot sections 6222, 6114 in terms of the height direction (D2). The second connect end portion 623 has a second connecting end 6232 in the form of a shaft extending toward the first outer arm 51. The second connecting end 6232 is spaced apart from the second friction connecting section 6116 in terms of the height direction (D2).

The second connecting member 63 is connected to the second outer connecting section 6115 and the second inner connecting section 6223 such that the second outer and inner arms 61, 62 are parallel to each other.

The second support bracket 64 substantially extends in the lengthwise direction (D1), and has an upper wall 641 securely connected to a side portion of the second support plate 131 (see FIG. 3), and a second retaining protrusion 642 slidably engaged in the second retaining slot 6213 to permit movement of the second support bracket 64 with the second inner arm 62. Additionally, the second support bracket 64 has an elongated slot 6411 extending in the lengthwise direction (D1) such that a positioning shaft 643 extends in the width direction (D3) to have two ends respectively engaged in the elongated slot 6411 and the other positioning hole 40.

The second friction increasing member 65 has two ends formed with penetrating holes 651 which are respectively and rotatably connected to the second connecting end 6232 of the second inner arm 62 and the second friction connecting section 6116 of the second outer arm 61 so as to provide a friction to angularly position the second arm unit 6.

Figure 11:
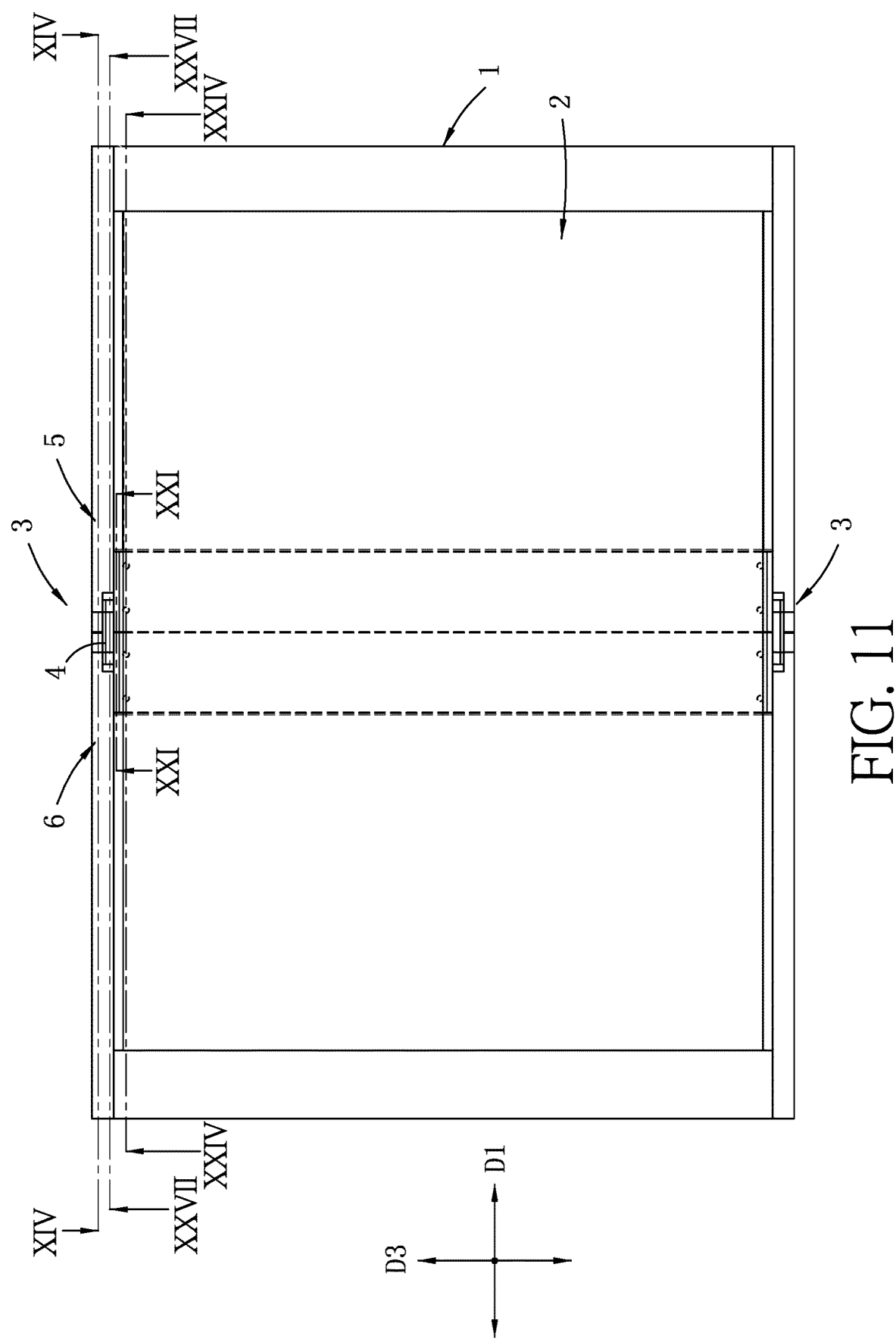
FIG. 11 is a top view of the embodiment in the unfolded state.
Figure 12:
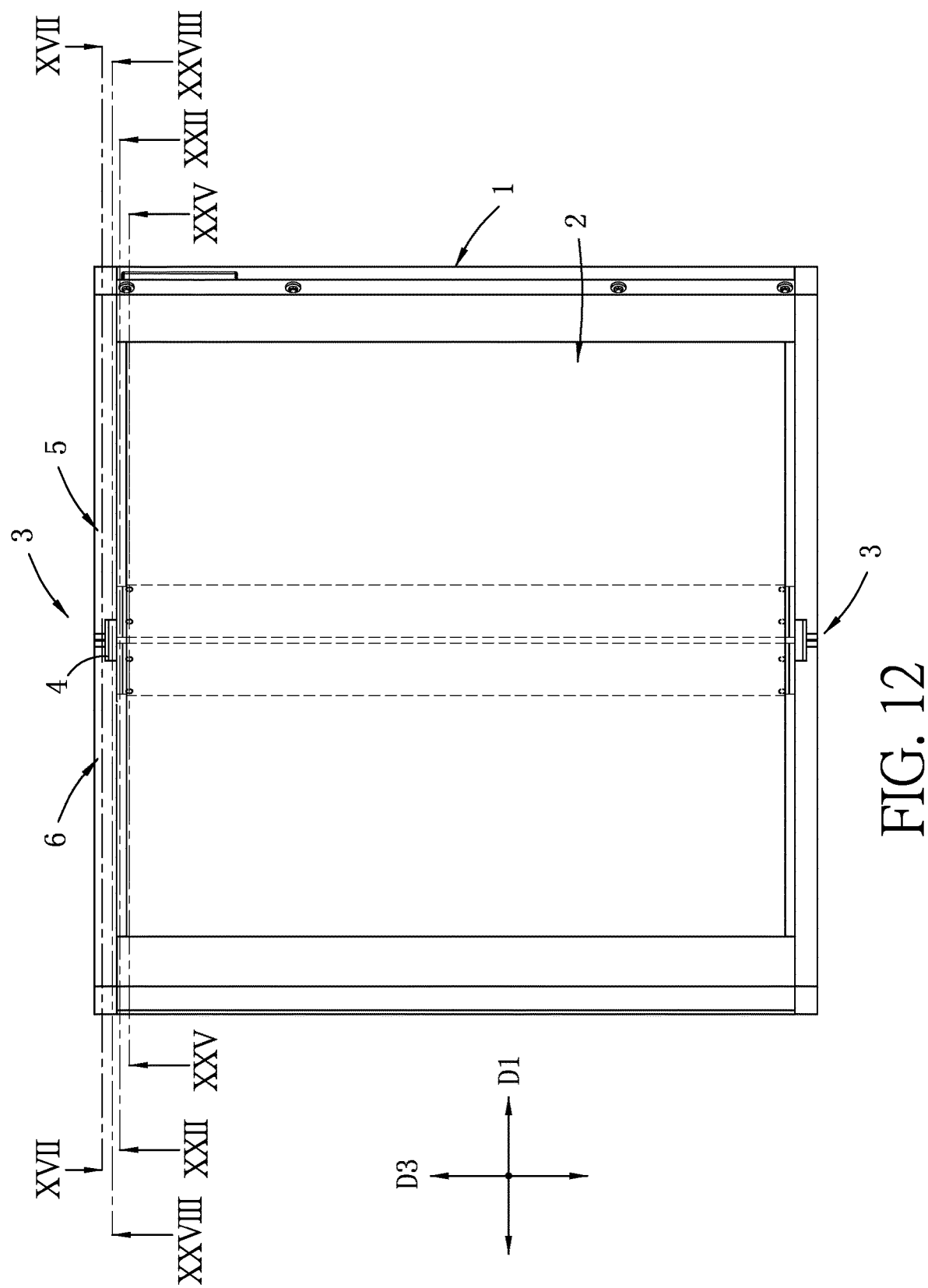
FIG. 12 is a top view of the embodiment during a middle state between the unfolded and folded states.
Figure 13:
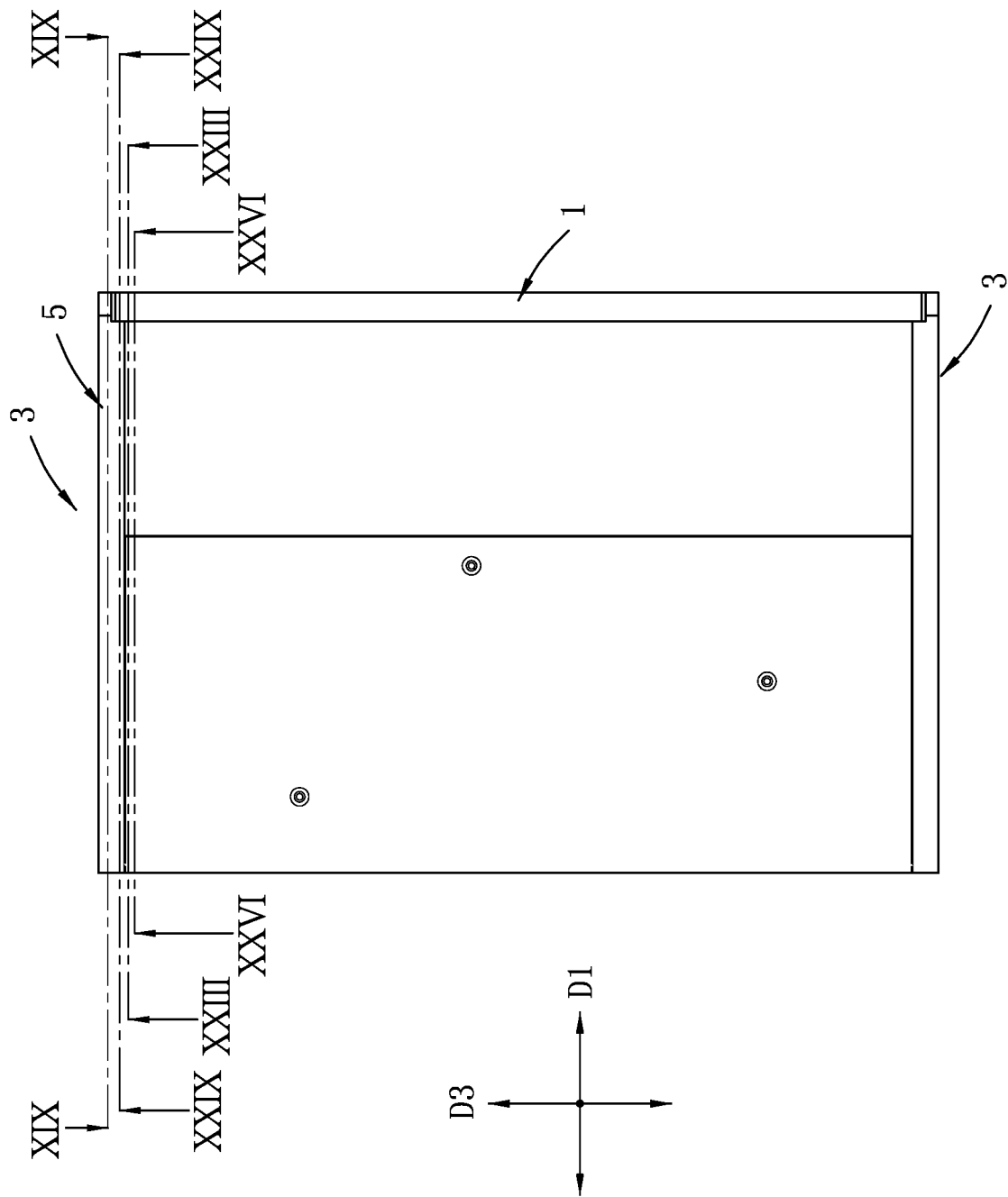
FIG. 13 is a top view of the embodiment in the folded state.

The first and second arm units 5, 6 are pivotable relative to each other between an unfolded position, where the first and second distal ends 510, 610 are remote from each other to have the first and second outer arms 51, 61 extending parallel to each other along the lengthwise direction (D1) (i.e., the flexible electronic device is in the unfolded state), and a folded position, where the first and second distal ends 510, 610 are close to each other and have the first and second outer arms 51, 61 extending in the height direction (D2) (i.e., the flexible electronic device is in the folded state). FIGS. 11 to 13 respectively illustrate the flexible electronic device of this embodiment in the unfolded state, a middle state and the folded state.

Referring to FIG. 14, in this embodiment, each of the hinge mechanisms 3 is of double parallel linkage mechanism, wherein a first line (L1) passing through the first outer pivot section 5114 and the first outer connecting section 5115 is kept to be parallel to a second line (L2) passing through the first inner pivot section 5222 and the first inner connecting section 5223, and a third line (L3) passing through the second outer pivot section 6114 and the second outer connecting section 6115 is kept to be parallel to a fourth line (L4) passing through the second inner pivot section 6222 and the second inner connecting section 6223.

When the flexible electronic device is shifted from the unfolded state to the folded state, for example, through operation of the first substrate unit 12 by a user, the first arm unit 5 is pivoted toward the second arm unit (e.g., counterclockwise). During this pivoting, referring to FIGS. 15 to 20, the first inner arm 52 is rotated alongside the first outer arm 51 through the first connecting member 53. With the first line (L1) kept in parallel to the second line (L2), the end of the first connecting member 53 connected to the first inner connecting section 5223 is rotated clockwise about the end connected to the first outer connecting section 5115 such that the first inner arm 52 is moved relative to the first outer arm 51 from a proximate position, where the first inner arm 52 is proximate to a top side (i.e., the first upper wall 5111) of the first accommodation chamber 5117 to bring the first support plate 121 in a horizontal state, to a distal position, where the first inner arm 52 is proximate to a bottom side (i.e., the first lower wall 5112) of the first accommodation chamber 5117 to bring the first support plate 121 in an upright state.

Figure 21:
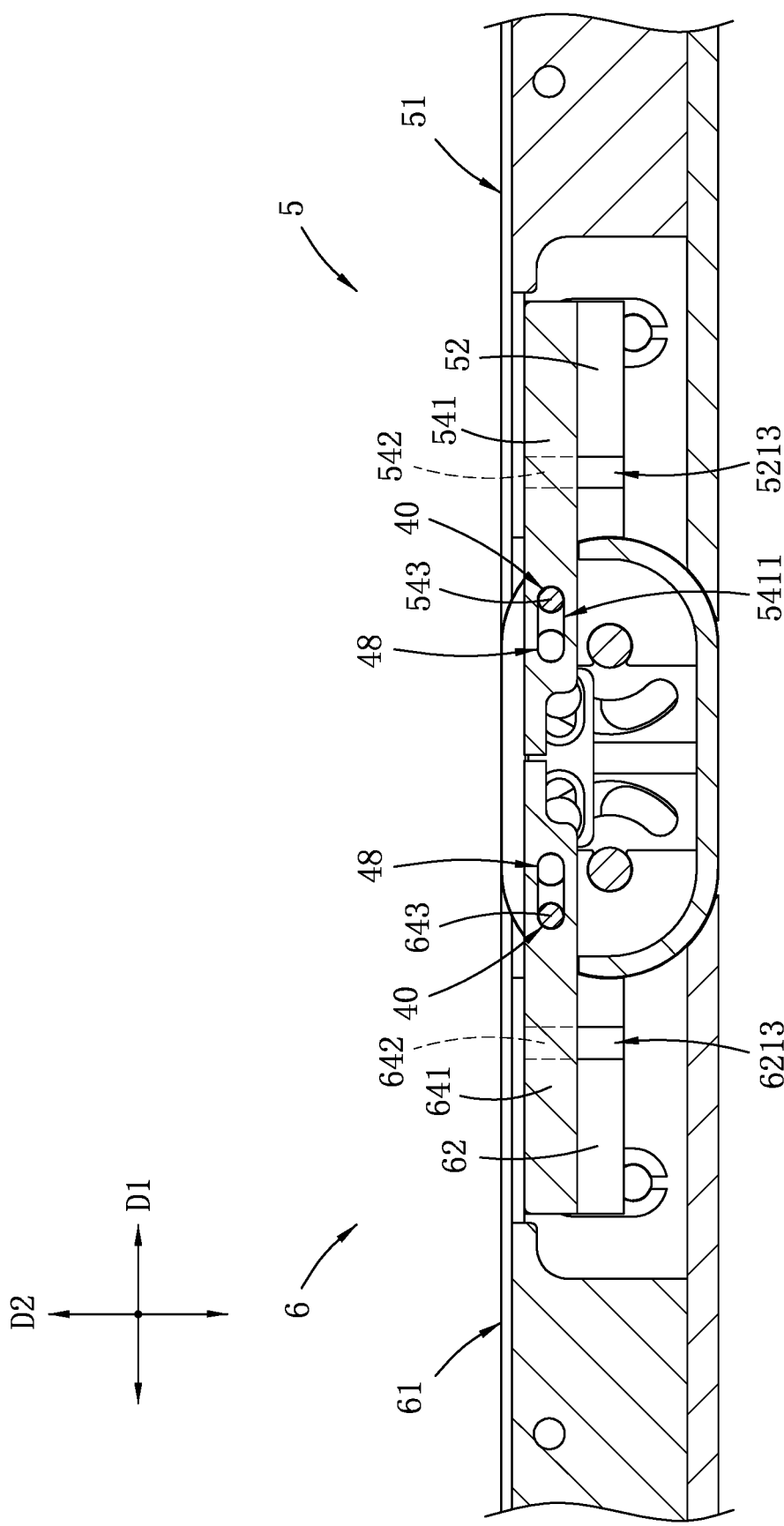
FIG. 21 is a fragmentary sectional view taken along line XXI-XXI of FIG. 11.
Figure 22:
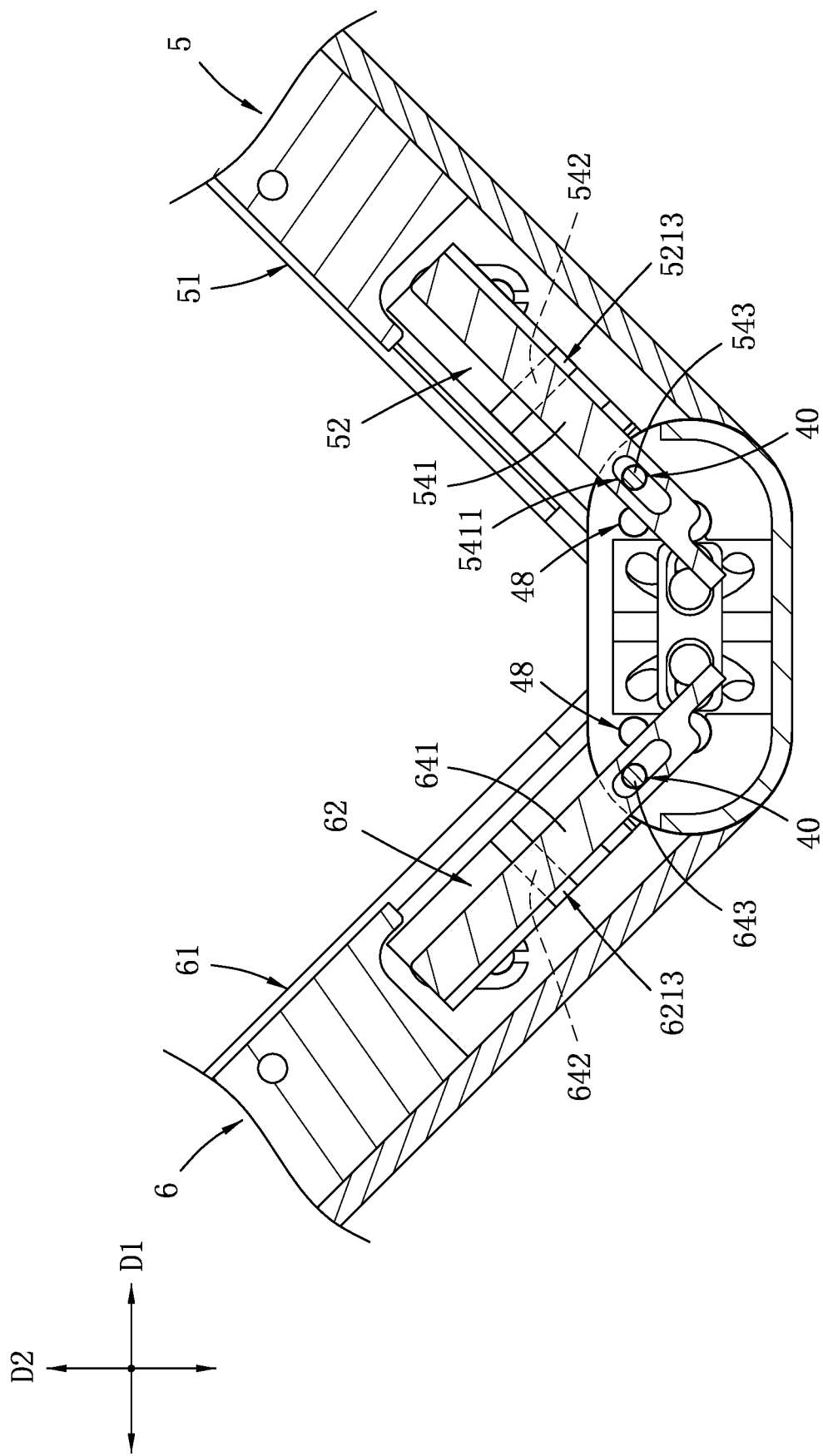
FIG. 22 is a fragmentary sectional view taken along line XXII-XXII of FIG. 12.
Figure 23:
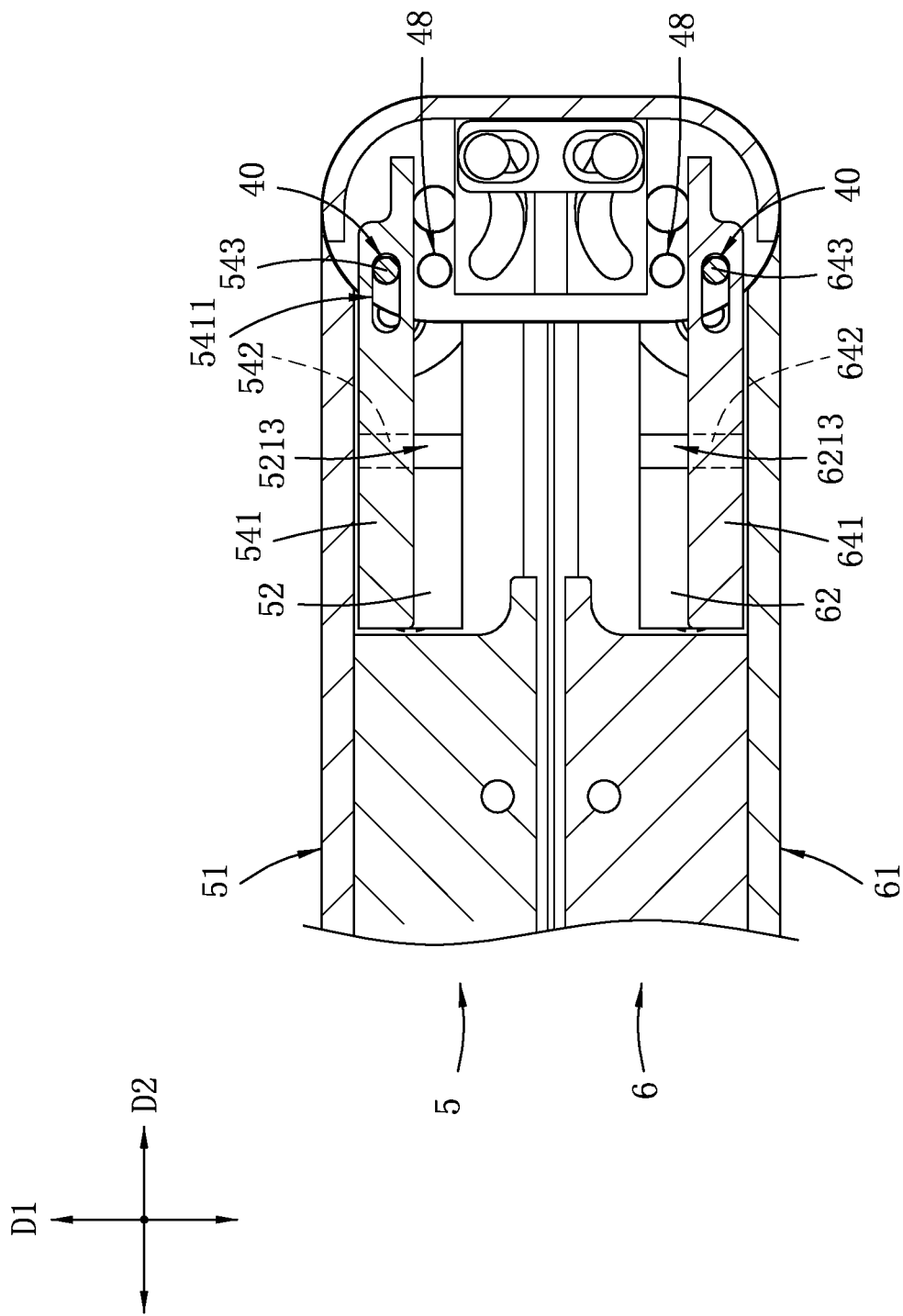
FIG. 23 is a fragmentary sectional view taken along line XXIII-XXIII of FIG. 13.
Figure 24:
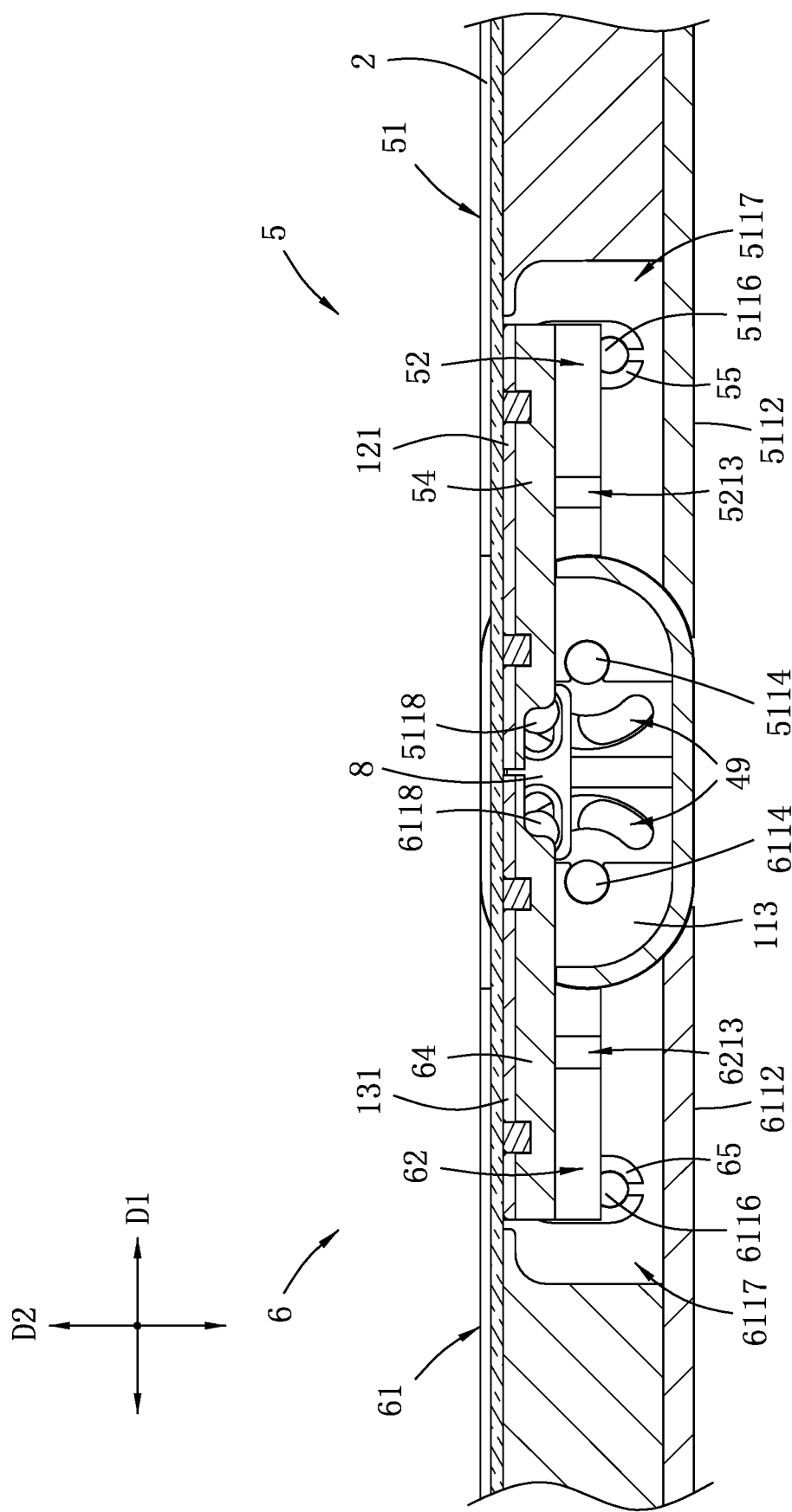
FIG. 24 is a fragmentary sectional view taken along line XXIV-XXIV of FIG. 11.
Figure 25:
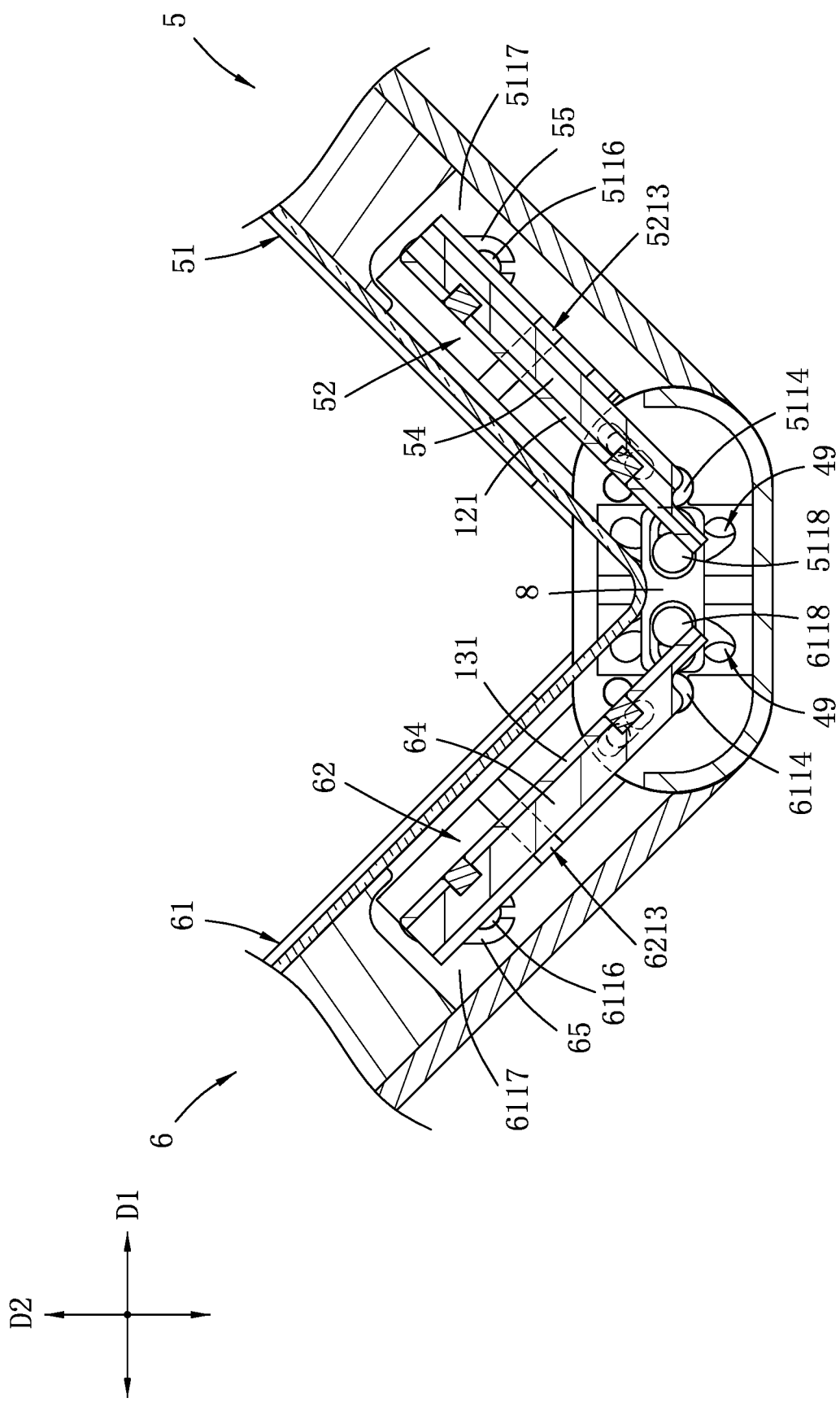
FIG. 25 is a fragmentary sectional view taken along line XXV-XXV of FIG. 12.

Moreover, during this pivoting, the end of the first friction increasing member 55 connected to the first connecting end 5232 is rotated clockwise about the first friction connecting section 5116 relative to the first outer arm 51 so as to avoid interfering with the movement of the first inner arm 52 relative to the first outer arm 51. Furthermore, referring to FIGS. 21 to 23, the first support bracket 54 is rotated counterclockwise with the first inner arm 52. Specifically, the first support bracket 54 is rotated about the positioning shaft 543 and moved outwardly relative to the positioning shaft 543. With the positioning shaft 543 slidably engaged in the elongated slot 5411 of the first support bracket 54, the first retaining protrusion 542 is slidable in and along the first retaining slot 5213 during the rotation of the first support bracket 54. Thus, referring to FIGS. 24 to 26, the first support plate 121 is moved relative to the first inner arm 52, and the distance by which the first retaining protrusion 542 is moved in the first retaining slot 5213 is the same as the distance between the corresponding positioning hole 40 and the second pivot hole 48 (see FIGS. 21 to 23).

Similarly, when the second substrate unit 13 is operated by a user to pivot the second arm unit 6 toward the first arm unit 5, the movement of the second arm unit 6 is similar to that of the first arm unit 5 but in an opposite direction. As shown in FIGS. 15 to 20, the second inner arm 62 is rotated with the second outer arm 61 through the second connecting member 63, and is moved relative to the second outer arm 61 from a proximate position, where the second inner arm 62 is proximate to a top side (i.e., the second upper wall 6111) of the second accommodation chamber 6117 to bring the second support plate 131 in a horizontal state, to a distal position, where the second inner arm 62 is proximate to a bottom side (i.e., the second lower wall 6112) of the second accommodation chamber 6117 to bring the second support plate 131 in an upright state so as to provide a leeway distance (d) between the first and second inner arms 52, 62. Meanwhile, referring to FIGS. 24 to 26, the second support plate 131 is moved with the second support bracket 64 relative to the second inner arm 62 such that a leeway 7 is formed between the first and second support plates 121, 131 for the flexible display 2 to be bendably received therein. The leeway distance (d) is determined in accordance with the dimension of the flexible display 2.

Figure 27:
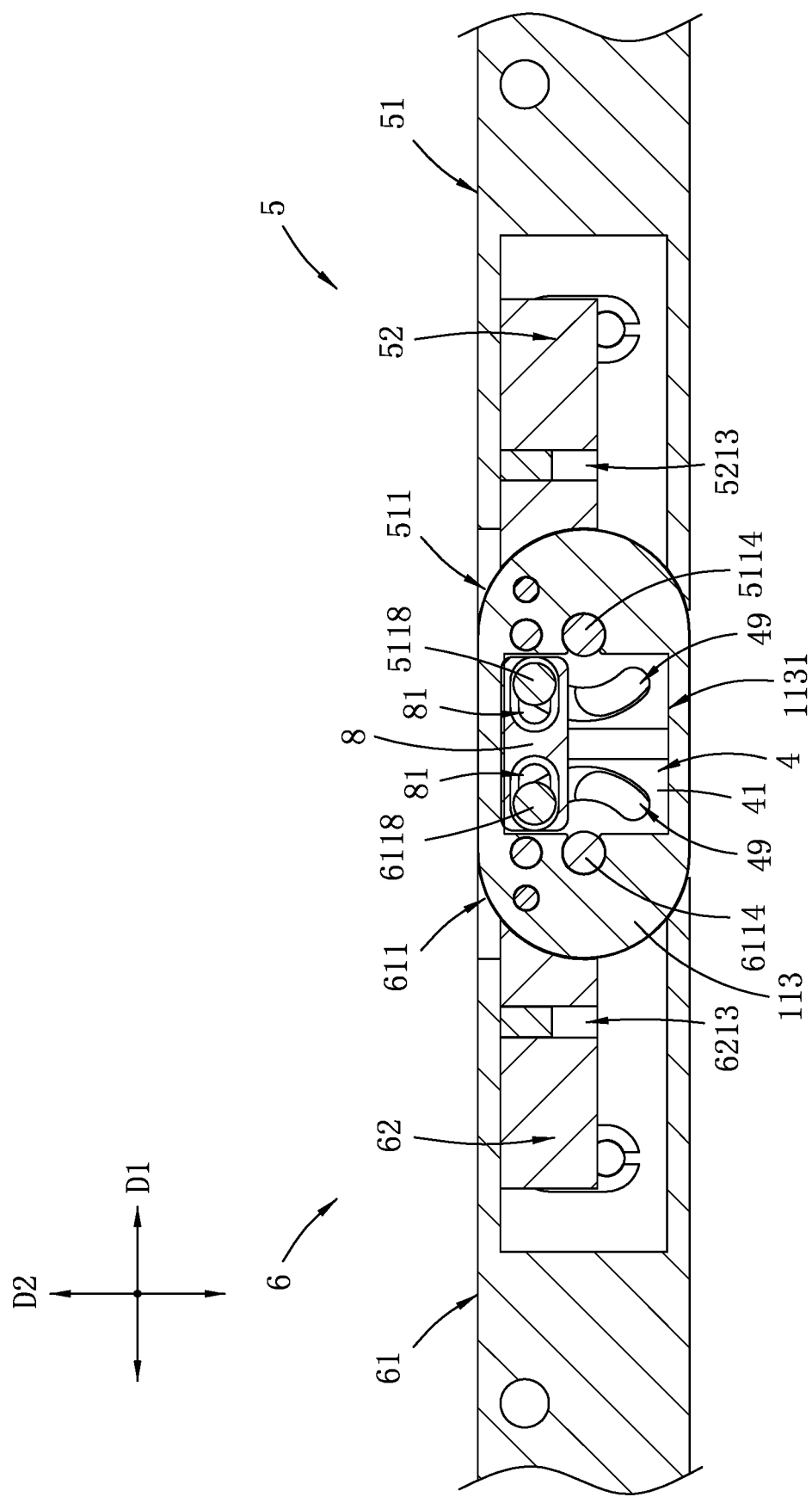
FIG. 27 is a fragmentary sectional view taken along line XXVII-XXVII of FIG. 11.
Figure 28:
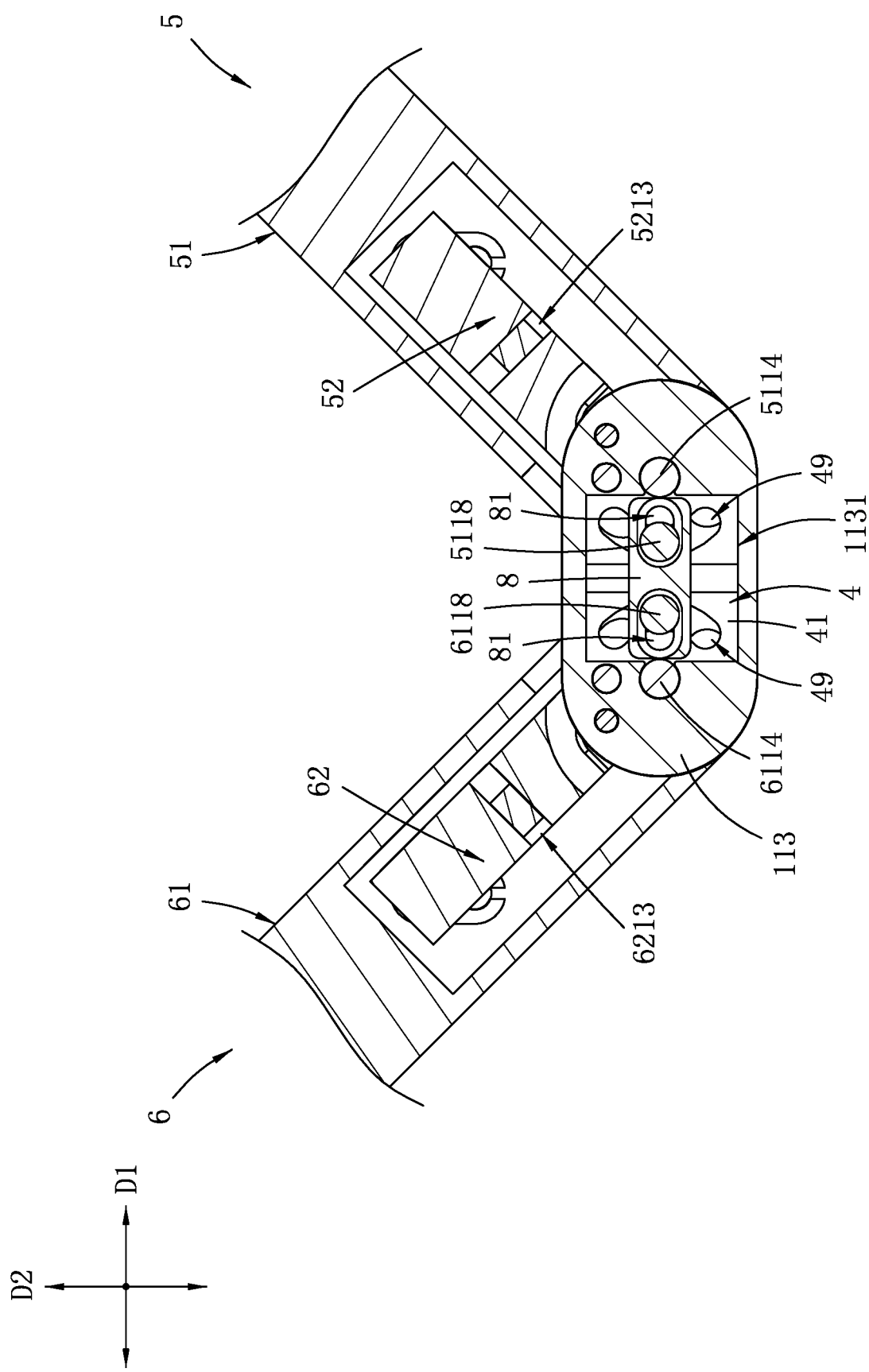
FIG. 28 is a fragmentary sectional view taken along line XXVIII-XXVIII of FIG. 12.
Figure 29:
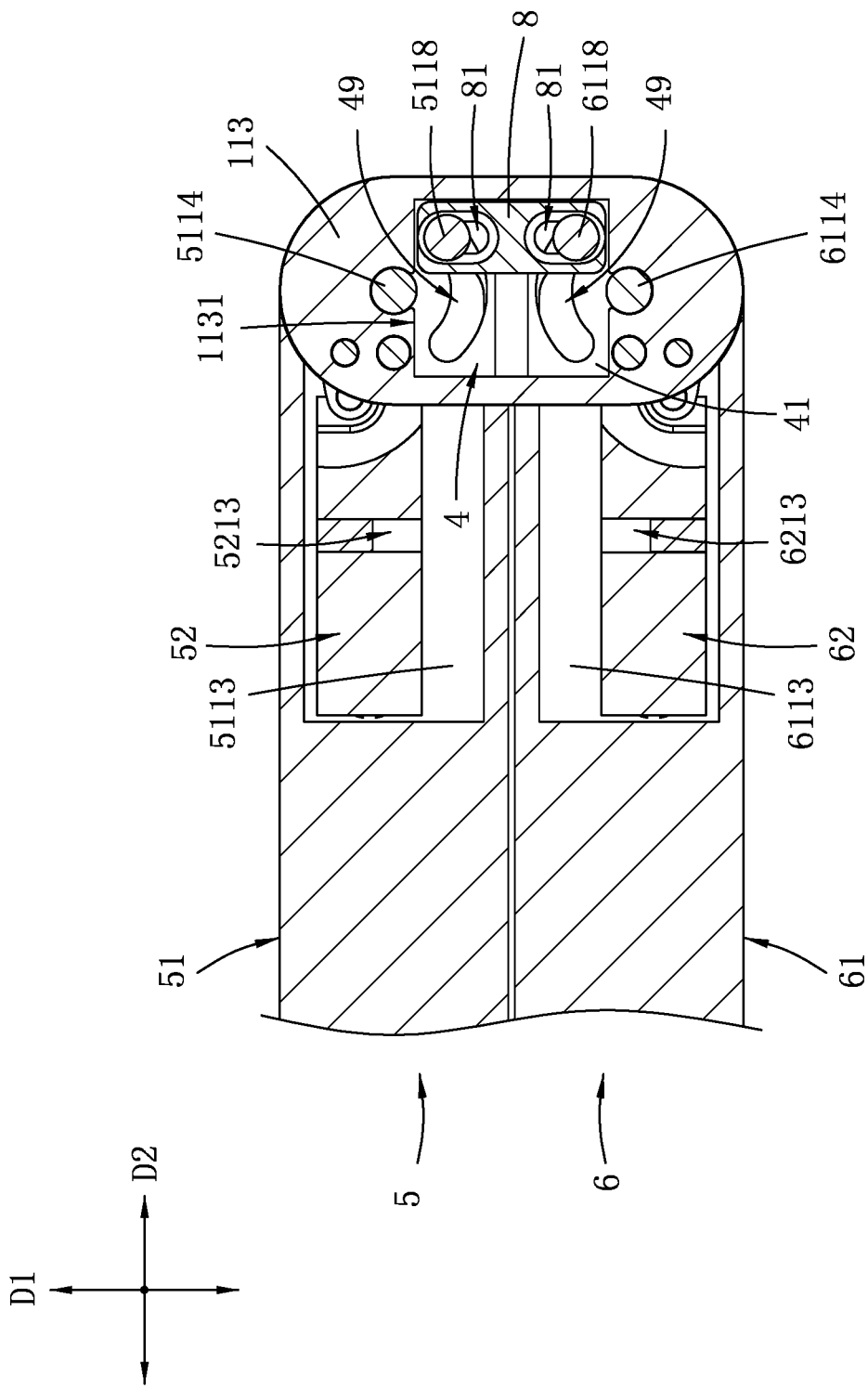
FIG. 29 is a fragmentary sectional view taken along line XXIX-XXIX of FIG. 13.

Additionally, in this embodiment, the first and second arm units 5, 6 may be pivoted synchronously through a synchronously driving mechanism. Specifically, referring to FIG. 6, the first proximate end 511 of the first outer arm 51 has a first outer sliding section 5118 which is in the form of a shaft that has an end connected to the first side wall 5113 and that extends in the width direction (D3) to be slidable through one of the arcuate slots 49. The second proximate end 611 of the second outer arm 61 has a second outer sliding section 6118 which is in the form of a shaft that has an end connected to the second side wall 6113 and that extends in the width direction (D3) to be slidable through the other one of the arcuate slots 49. Each hinge mechanism 3 further includes a synchronously driving member 8 which is rectangular and disposed outboard of the inner major surface 41 of the cam 4. The synchronously driving member 8 has two penetrating holes 81 which are spaced apart from each other in the lengthwise direction (D1) and respectively aligned with the arcuate slots 49. The first sliding section 5118 extends through one of the arcuate slots 49 and the aligned penetrating hole 81 to be slidable along the arcuate slot 49. The second sliding section 6118 extends through the other one of the arcuate slots 49 and the aligned penetrating hole 81 to be slidable along the arcuate slot 49. Referring to FIGS. 27 to 29, during the pivoting of the first arm unit 5 toward the second arm unit 6 (or the pivoting of the second arm unit 6 toward the first arm unit 5), the first sliding section 5118 slides downwardly along the arcuate slot 49 and moves the synchronously driving member 8 downwardly such that the second sliding section 6118 is moved downwardly along the arcuate slot 49 to transmit the rotation of the first outer arm 51 to the second outer arm 61 to rotate the second arm unit 6 in an opposite rotational direction relative to that of the first arm unit 5 so as to make synchronous pivoting of the first and second arm units 5, 6 in opposite rotational directions.

Figure 26:
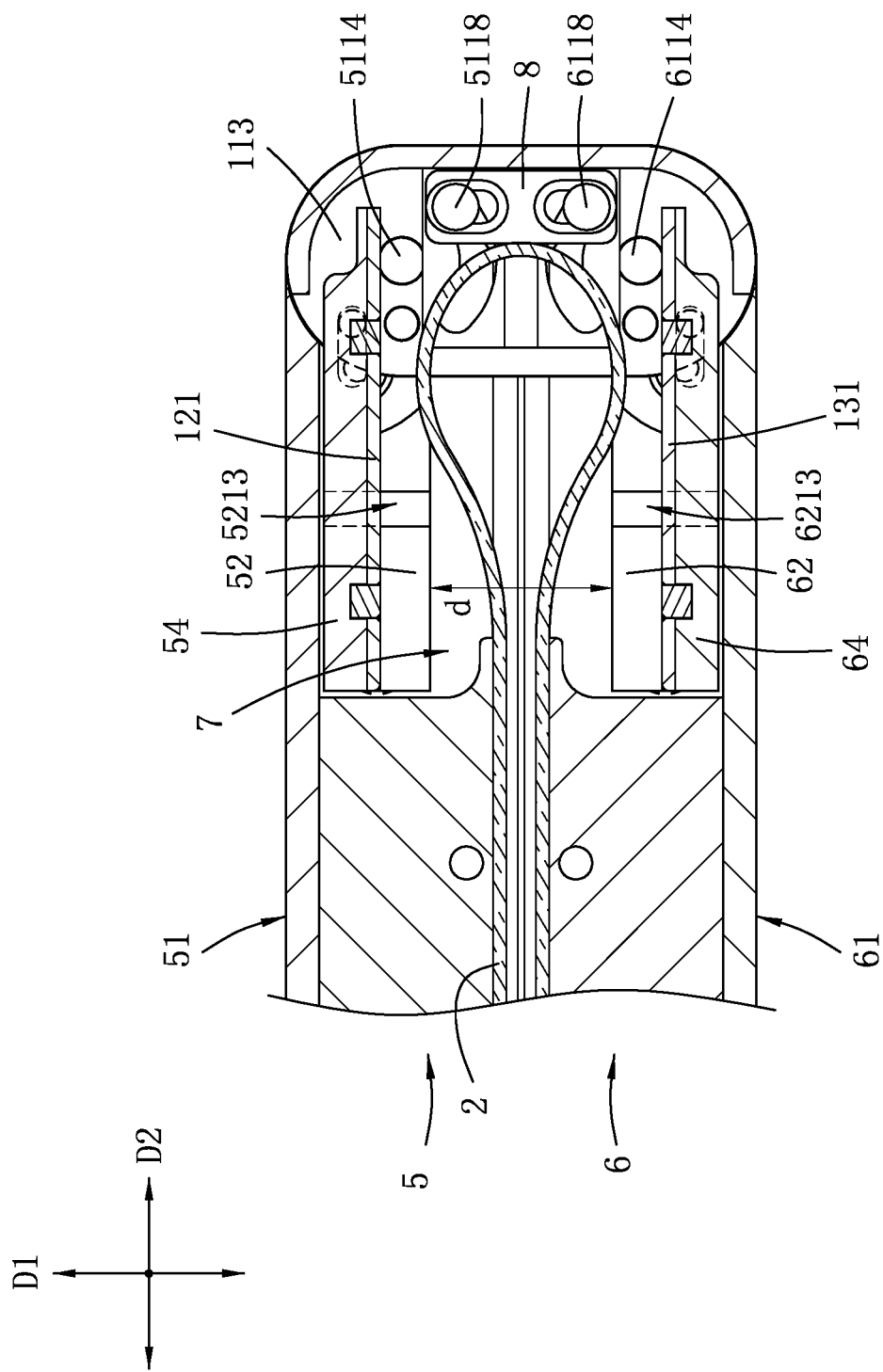
FIG. 26 is a fragmentary sectional view taken along line XXVI-XXVI of FIG. 13.

As illustrated in FIG. 26, with the first and second inner arms 52, 62 of the hinge mechanism 3 synchronously pivoting relative to the cam 4, the first and second support plates 121, 131 are moved in opposite directions to provide the leeway 7 therebetween for receiving the bending portion of the flexible display 2 without the need to increase the size of the flexible electronic device. Moreover, the hinge mechanisms 3 are not directly disposed on the flexible display 2 so as to allow for a greater degree of freedom in the design of the hinge mechanisms 3 without need to consider bending of the flexible display but with the reduction of the manufacturing cost achieved.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A hinge mechanism comprising:
   a cam extending in a lengthwise direction to terminate at two peripheral cam surface sections, and having two first pivot holes which are spaced apart from each other in the lengthwise direction, and two second pivot holes each of which is spaced apart from a respective one of said first pivot holes in a height direction that is transverse to the lengthwise direction;
   a first arm unit including
      a first outer arm which has first proximate and distal ends relative to said cam, said first proximate end having a first accommodation chamber, a first outer pivot section which is formed in said first accommodation chamber and journalled to one of said first pivot holes, and a first outer connecting section which is formed in said first accommodation chamber and spaced apart from said first outer pivot section,
      a first inner arm which is disposed in said first accommodation chamber, said first inner arm having a first pivot end portion which extends toward said cam, and a cam follower which is configured to be slidably engaged with one of said peripheral cam surface sections, said first pivot end portion having a first inner pivot section which is journalled to one of said second pivot holes, and a first inner connecting section which is spaced apart from said first inner pivot section, and
      a first connecting member which has two opposite ends respectively connected to said first outer connecting section and said first inner connecting section, and which is configured such that a first line passing through said first outer pivot section and said first outer connecting section is parallel to a second line passing through said first inner pivot section and said first inner connecting section; and
   a second arm unit including a second outer arm which has second proximate and distal ends relative to said cam, said second proximate end having a second accommodation chamber, a second outer pivot section which is formed in said second accommodation chamber and journalled to the other one of said first pivot holes, and a second outer connecting section which is formed in said second accommodation chamber and spaced apart from said second outer pivot section, a second inner arm which is disposed in said second accommodation chamber, said second inner arm having a second pivot end portion which extends toward said cam, and a cam follower which is configured to be slidably engaged with the other one of said peripheral cam surface sections, said second pivot end portion having a second inner pivot section which is journalled to the other one of said second pivot holes, and a second inner connecting section which is spaced apart from said second inner pivot section, and a second connecting member which has two opposite ends respectively connected to said second outer connecting section and said second inner connecting section, and which is configured such that a third line passing through said second outer pivot section and said second outer connecting section is parallel to a fourth line passing through said second inner pivot section and said second inner connecting section, wherein said first and second arm units are pivotable relative to each other between an unfolded position, where said first and second distal ends are remote from each other to have said first and second outer arms extending parallel to each other along the lengthwise direction, and a folded position, where said first and second distal ends are close to each other and have said first and second outer arms extending in the height direction, and wherein, during the pivoting of said first and second arm units from the unfolded position to the folded position, said first inner arm is rotated with said first outer arm through said first connecting member, and is moved relative to said first outer arm from a proximate position, where said first inner arm is proximate to a top side of said first accommodation chamber, to a distal position, where said first inner arm is proximate to a bottom side of said first accommodation chamber, and said second inner arm is rotated with said second outer arm through said second connecting member, and is moved relative to said second outer arm from a proximate position, where said second inner arm is proximate to a top side of said second accommodation chamber, to a distal position, where said second inner arm is proximate to a bottom side of said second accommodation chamber so as to provide a leeway distance between said first and second inner arms.

2. The hinge mechanism as claimed in claim 1, wherein each of said peripheral cam surface sections angularly extends about a respective one of said first pivot holes so as to allow slidable engagement of said cam follower with said respective peripheral cam surface section with the pivoting of said first and second arm units.

3. The hinge mechanism as claimed in claim 2, wherein said first accommodation chamber of said first proximate end of said first outer arm is bordered by a first upper wall, a first lower wall spaced apart from said first upper wall in the height direction, and a first side wall extending in the height direction to interconnect said first upper and lower walls such that said first accommodation chamber has an access opening opposite to said first side wall in a width direction that is transverse to both the lengthwise and height directions, each of said first outer and pivot and connecting sections being in the form of a shaft which has an end connected to said first side wall and which extends in the width direction, said first outer connecting section being disposed lower than said first outer pivot section in the unfolded position, and wherein said second accommodation chamber of said second proximate end of said second outer arm is bordered by a second upper wall, a second lower wall spaced apart from said second upper wall in the height direction, and a second side wall extending in the height direction to interconnect said second upper and lower walls such that said second accommodation chamber has an access opening opposite to said second side wall in the width direction, each of said second outer and pivot and connecting sections being in the form of a shaft which has an end connected to said second side wall and which extends in the width direction, said second outer connecting section being disposed lower than said second outer pivot section in the unfolded position.

4. The hinge mechanism as claimed in claim 3, wherein said first pivot end portion of said first inner arm has an end wall body which extends from said cam follower in the lengthwise direction toward said cam, each of said first inner pivot and connecting sections being in the form of a shaft which has an end connected to said end wall body and which extends in the width direction, said first inner connecting section being disposed above said first outer connecting section in the unfolded position, and between said first inner and outer pivot sections in terms of the height direction, and wherein said second pivot end portion of said second inner arm has an end wall body which extends from said cam follower in the lengthwise direction toward said cam, each of said second inner pivot and connecting sections being in the form of a shaft which has an end connected to said end wall body and which extends in the width direction, said second inner connecting section being disposed above said second outer connecting section in the unfolded position, and between said second inner and outer pivot sections in terms of the height direction.

5. The hinge mechanism as claimed in claim 4, said hinge mechanism being adapted to be mounted on a support structure which includes first and second support plates, wherein said first inner arm has a first retaining slot facing away from said first outer arm, said second inner arm having a second retaining slot facing away from said second outer arm;

said first arm unit including a first support bracket which is rotatably connected to said cam and which has a first retaining protrusion that is slidably engaged in said first retaining slot to permit movement of said first support bracket with said first inner arm, said first support bracket being disposed for supporting an end of the first support plate;

said second arm unit including a second support bracket which is rotatably connected to said cam and which has a second retaining protrusion that is slidably engaged in said second retaining slot to permit movement of said second support bracket with said second inner arm, said second support bracket being disposed for supporting an end of the second support plate such that, during the pivoting of said first and second arm units from the unfolded position to the folded position, said first and second support brackets are moved with said first and second inner arms from the proximate position to the distal position so as to provide a leeway between the first and second support plates.

6. The hinge mechanism as claimed in claim 3, wherein:
said cam has two arcuate slots formed between said first pivot holes in terms of the lengthwise direction and spaced apart from each other in the lengthwise direction, each of said arcuate slots angularly extending about a respective one of said first pivot holes, said cam having inner and outer major surfaces opposite to each other in the width direction;
said first proximate end of said first outer arm having a first outer sliding section which is in the form of a shaft that has an end connected to said first side wall and that extends in the width direction to be slidable through one of said arcuate slots;
said second proximate end of said second outer arm having a second outer sliding section which is in the form of a shaft that has an end connected to said second side wall and that extends in the width direction to be slidable through the other one of said arcuate slots;
said hinge mechanism further comprising a synchronously driving member which is disposed outboard of said inner major surface of said cam and coupled with said first and second sliding sections to transmit the rotation of said first outer arm to said second outer arm to rotate said second arm unit in an opposite rotational direction relative to that of said first arm unit so as to make synchronous pivoting of said first and second arm units in opposite rotational directions.

7. The hinge mechanism as claimed in claim 1, wherein:
said first arm unit includes a first friction increasing member having an end which is rotatably connected to a first connecting end of said first inner arm opposite to said first pivot end portion, and an opposite end which is rotatably connected to said first outer arm so as to provide a friction to angularly position said first arm unit; and
said second arm unit includes a second friction increasing member having an end which is rotatably connected to a second connecting end of said second inner arm opposite to said second pivot end portion, and an opposite end which is rotatably connected to said second outer arm so as to provide a friction to angularly position said second arm unit.

8. A flexible electronic device comprising:
a flexible display;
a support structure including
  a base seat,
  a first substrate unit disposed above said base seat, and having a first support plate which is disposed adjacent to and rotatable relative to said base seat, and a first substrate plate which is connected and adjoined to said first support plate, and
  a second substrate unit disposed above said base seat and opposite to said first substrate unit in a lengthwise direction, and having a second support plate which is disposed adjacent to and rotatable relative to said base seat, and a second substrate plate which is connected and adjoined to said first support plate, wherein said first and second substrate plates are coplanar to cooperatively define a display supporting surface for said flexible display to be attached thereto, and said first and second support plates are coplanar to cooperatively define a carrying surface for a bending portion of said flexible display to be attached thereto; and
two hinge mechanisms disposed between said first and second substrate units and opposite to each other in a width direction that is transverse to the lengthwise direction, each of said hinge mechanisms including:
  a cam extending in the lengthwise direction to terminate at two peripheral cam surface sections, and having two first pivot holes which are spaced apart from each other in the lengthwise direction, and two second pivot holes each of which is spaced apart from a respective one of said first pivot holes in a height direction that is transverse to the lengthwise direction;
  a first arm unit disposed for said first substrate unit to be mounted thereon, and including
    a first outer arm which has first proximate and distal ends relative to said cam, said first proximate end having a first accommodation chamber, a first outer pivot section which is formed in said first accommodation chamber and journalled to one of said first pivot holes, and a first outer connecting section which is formed in said first accommodation chamber and spaced apart from said first outer pivot section,
    a first inner arm which is disposed in said first accommodation chamber, said first inner arm having a first pivot end portion which extends toward said cam, and a cam follower which is configured to be slidably engaged with one of said peripheral cam surface sections, said first pivot end portion having a first inner pivot section which is journalled to one of said second pivot holes, and a first inner connecting section which is spaced apart from said first inner pivot section, and
    a first connecting member which has two opposite ends respectively connected to said first outer connecting section and said first inner connecting section, and which is configured such that a first line passing through said first outer pivot section and said first outer connecting section is parallel to a second line passing through said first inner pivot section and said first inner connecting section; and
  a second arm unit disposed for said second substrate unit to be mounted thereon, and including
    a second outer arm which has second proximate and distal ends relative to said cam, said second proximate end having a second accommodation chamber, a second outer pivot section which is formed in said second accommodation chamber and journalled to the other one of said first pivot holes, and a second outer connecting section which is formed in said second accommodation chamber and spaced apart from said second outer pivot section,
    a second inner arm which is disposed in said second accommodation chamber, said second inner arm having a second pivot end portion which extends toward said cam, and a cam follower which is configured to be slidably engaged with the other one of said peripheral cam surface sections, said second pivot end portion having a second inner pivot section which is journalled to the other one of said second pivot holes, and a second inner connecting section which is spaced apart from said second inner pivot section, and a second connecting member which has two opposite ends respectively connected to said second outer connecting section and said second inner connecting section, and which is configured such that a third line passing through said second outer pivot section and said second outer connecting section is parallel to a fourth line passing through said second inner pivot section and said second inner connecting section, wherein said first and second arm units are pivotable relative to each other between an unfolded position, where said first and second distal ends are remote from each other to have said first and second outer arms extending parallel to each other along the lengthwise direction, and a folded position, where said first and second distal ends are close to each other and have said first and second outer arms extending in the height direction, and wherein, during the pivoting of said first and second arm units from the unfolded position to the folded position, said first inner arm is rotated with said first outer arm through said first connecting member, and is moved relative to said first outer arm from a proximate position, where said first inner arm is proximate to a top side of said first accommodation chamber to bring said first support plate in a horizontal state, to a distal position, where said first inner arm is proximate to a bottom side of said first accommodation chamber to bring said first support plate in an upright state, and said second inner arm is rotated with said second outer arm through said second connecting member, and is moved relative to said second outer arm from a proximate position, where said second inner arm is proximate to a top side of said second accommodation chamber to bring said second support plate in a horizontal state, to a distal position, where said second inner arm is proximate to a bottom side of said second accommodation chamber to bring said second support plate in an upright state so as to provide a leeway distance between said first and second inner arms and provide a leeway between said first and second support plates for said flexible display to be bendably received therein.

9. The flexible electronic device as claimed in claim 8, wherein said first accommodation chamber of said first proximate end of said first outer arm is bordered by a first upper wall, a first lower wall spaced apart from said first upper wall in the height direction, and a first side wall extending in the height direction to interconnect said first upper and lower walls such that said first accommodation chamber has an access opening opposite to said first side wall in a width direction that is transverse to both the lengthwise and height directions, each of said first outer and pivot and connecting sections being in the form of a shaft which has an end connected to said first side wall and which extends in the width direction, said first outer connecting section being disposed lower than said first outer pivot section in the unfolded position, and wherein said second accommodation chamber of said second proximate end of said second outer arm is bordered by a second upper wall, a second lower wall spaced apart from said second upper wall in the height direction, and a second side wall extending in the height direction to interconnect said second upper and lower walls such that said second accommodation chamber has an access opening opposite to said second side wall in the width direction, each of said second outer and pivot and connecting sections being in the form of a shaft which has an end connected to said second side wall and which extends in the width direction, said second outer connecting section being disposed lower than said second outer pivot section in the unfolded position.

10. The flexible electronic device as claimed in claim 9, wherein said first pivot end portion of said first inner arm has an end wall body which extends from said cam follower in the lengthwise direction toward said cam, each of said first inner pivot and connecting sections being in the form of a shaft which has an end connected to said end wall body and which extends in the width direction, said first inner connecting section being disposed above said first outer connecting section in the unfolded position, and between said first inner and outer pivot sections in terms of the height direction, and wherein said second pivot end portion of said second inner arm has an end wall body which extends from said cam follower in the lengthwise direction toward said cam, each of said second inner pivot and connecting sections being in the form of a shaft which has an end connected to said end wall body and which extends in the width direction, said second inner connecting section being disposed above said second outer connecting section in the unfolded position, and between said second inner and outer pivot sections in terms of the height direction.

11. The flexible electronic device as claimed in claim 9, wherein:

said cam has two arcuate slots formed between said first pivot holes in terms of the lengthwise direction and spaced apart from each other in the lengthwise direction, each of said arcuate slots angularly extending about a respective one of said first pivot holes, said cam having inner and outer major surfaces opposite to each other in the width direction;

said first proximate end of said first outer arm having a first outer sliding section which is in the form of a shaft that has an end connected to said first side wall and that extends in the width direction to be slidable through one said arcuate slots;

said second proximate end of said second outer arm having a second outer sliding section which is in the form of a shaft that has an end connected to said second side wall and that extends in the width direction to be slidable through the other one of said arcuate slots;

each of said hinge mechanisms including a synchronously driving member which is disposed outboard of said inner major surface of said cam and coupled with said first and second sliding sections to transmit the rotation of said first outer arm to said second outer arm to rotate said second arm unit in an opposite rotational direction relative to that of said first arm unit so as to make synchronous pivoting of said first and second arm units in opposite rotational directions.

12. The flexible electronic device as claimed in claim 8, wherein:

said first inner arm has a first retaining slot facing away from said first outer arm, said second inner arm having a second retaining slot facing away from said second outer arm;

said first arm unit including a first support bracket which is rotatably connected to said cam and which has a first retaining protrusion that is slidably engaged in said first retaining slot to permit movement of said first support bracket with said first inner arm, said first support bracket being disposed for supporting an end of said first support plate;

said second arm unit including a second support bracket which is rotatably connected to said cam and which has a second retaining protrusion that is slidably engaged in said second retaining slot to permit movement of said second support bracket with said second inner arm, said second support bracket being disposed for supporting an end of said second support plate such that, during the pivoting of said first and second arm units from the unfolded position to the folded position, said first and second support brackets are moved with said first and second inner arms from the proximate position to the distal position so as to provide said leeway between said first and second support plates.

13. The flexible electronic device as claimed in claim 12, wherein:

said first arm unit includes a first friction increasing member having an end which is rotatably connected to a first connecting end of said first inner arm opposite to said first pivot end portion, and an opposite end which is rotatably connected to said first outer arm so as to provide a friction to angularly position said first arm unit; and said second arm unit includes a second friction increasing member having an end which is rotatably connected to a second connecting end of said second inner arm opposite to said second pivot end portion, and an opposite end which is rotatably connected to said second outer arm so as to provide a friction to angularly position said second arm unit.

* * * * *